(12) United States Patent
Kuwata

(10) Patent No.: US 6,959,061 B1
(45) Date of Patent: Oct. 25, 2005

(54) PHASE COMPARATOR CIRCUIT

(75) Inventor: Naoki Kuwata, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/360,270

(22) Filed: Jul. 26, 1999

(30) Foreign Application Priority Data

Oct. 7, 1998 (JP) .................. 10-285150

(51) Int. Cl.$^7$ .......................................... H03D 13/00
(52) U.S. Cl. ........................................ 375/373; 327/12
(58) Field of Search ................. 375/371, 373, 375/375, 376; 327/12, 156

(56) References Cited

U.S. PATENT DOCUMENTS

| | | | |
|---|---|---|---|
| 4,157,514 A | 6/1979 | Naito et al. | |
| 4,901,026 A | 2/1990 | Phillips et al. | |
| 5,473,639 A | 12/1995 | Lee et al. | |
| 5,589,801 A * | 12/1996 | Yamamura et al. | 331/14 |
| 6,151,356 A * | 11/2000 | Spagnoletti et al. | 375/226 |
| 6,218,875 B1 * | 4/2001 | Mizokuchi | 327/156 |
| 6,496,552 B2 * | 12/2002 | Tomofuji et al. | 375/373 |
| 6,496,555 B1 * | 12/2002 | Soda | 375/376 |

FOREIGN PATENT DOCUMENTS

| | | |
|---|---|---|
| EP | 0 379 113 | 7/1990 |
| EP | 0 625 837 | 11/1994 |
| EP | 0 735 692 | 10/1996 |
| JP | 59-111415 | 6/1984 |
| JP | 60-183854 | 9/1985 |
| JP | 2-152319 | 6/1990 |
| JP | 56-107632 | 8/1991 |
| JP | 5-191237 | 7/1993 |
| JP | 6-216892 | 8/1994 |
| JP | 6-283985 | 10/1994 |
| JP | 8-237104 | 9/1996 |

* cited by examiner

*Primary Examiner*—Khai Tran
*Assistant Examiner*—David B. Lugo
(74) *Attorney, Agent, or Firm*—Katten Muchin Rosenman LLP

(57) ABSTRACT

A phase comparison circuit has (1) a data discriminator to which a data signal is input for discriminating the data signal using a clock signal, (2) a logic circuit for outputting the exclusive-OR data of the data signal and a data discrimination signal output by the data discriminator and inputting the result of the exclusive-OR as a phase-difference signal to a clock generator which generates the clock signal, (3) an erroneous-synchronization phase detector for detecting whether the phase difference between the data signal and the clock signal resides within a range of phases for which there is a possibility of erroneous synchronization, and (4) an output fixing unit which holds the phase-difference signal at a fixed value if the phase difference resides within the above-mentioned range of phases, thereby it is possible to eliminate erroneous synchronization in which the clock generator is locked to a phase other than a target phase.

12 Claims, 30 Drawing Sheets

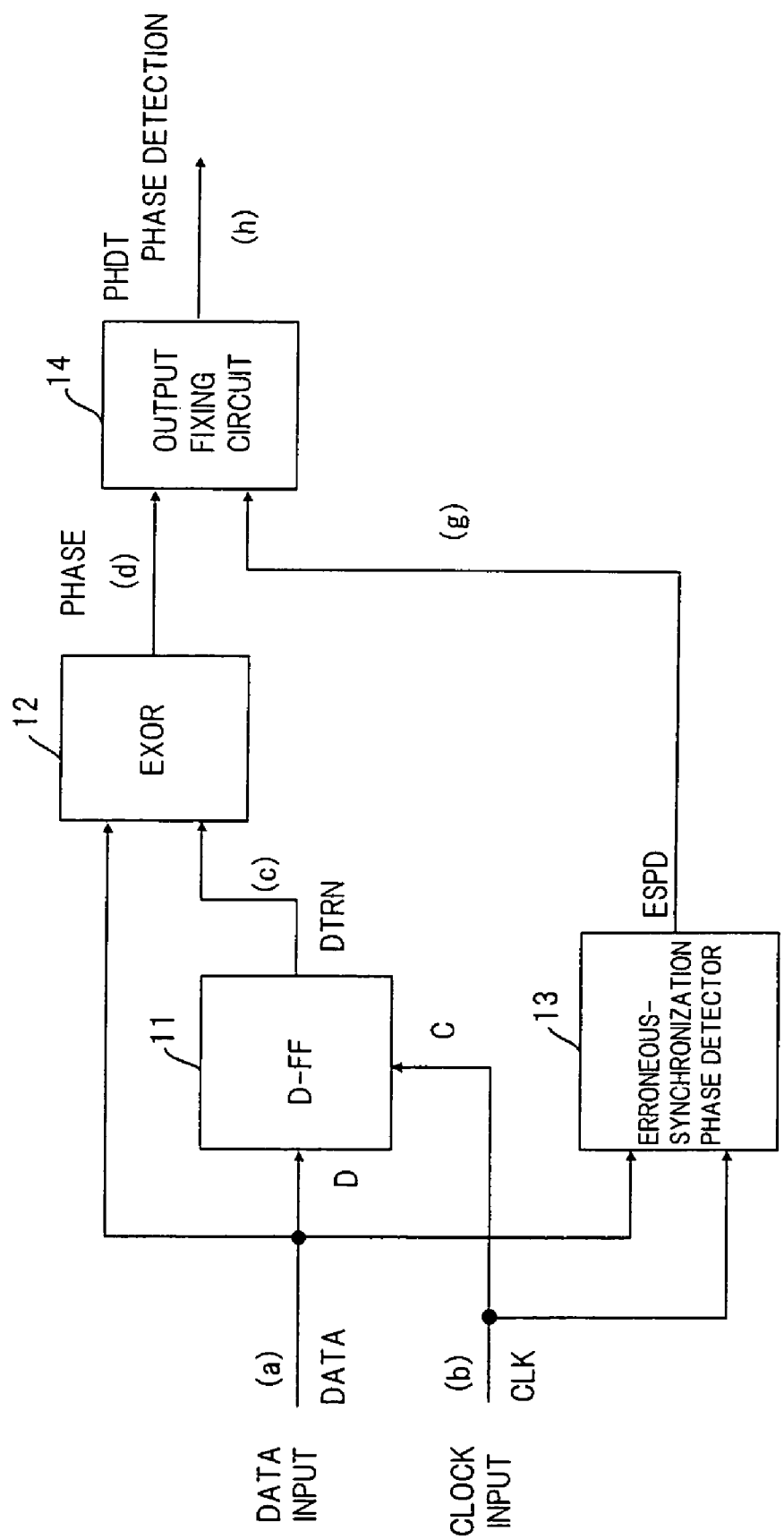

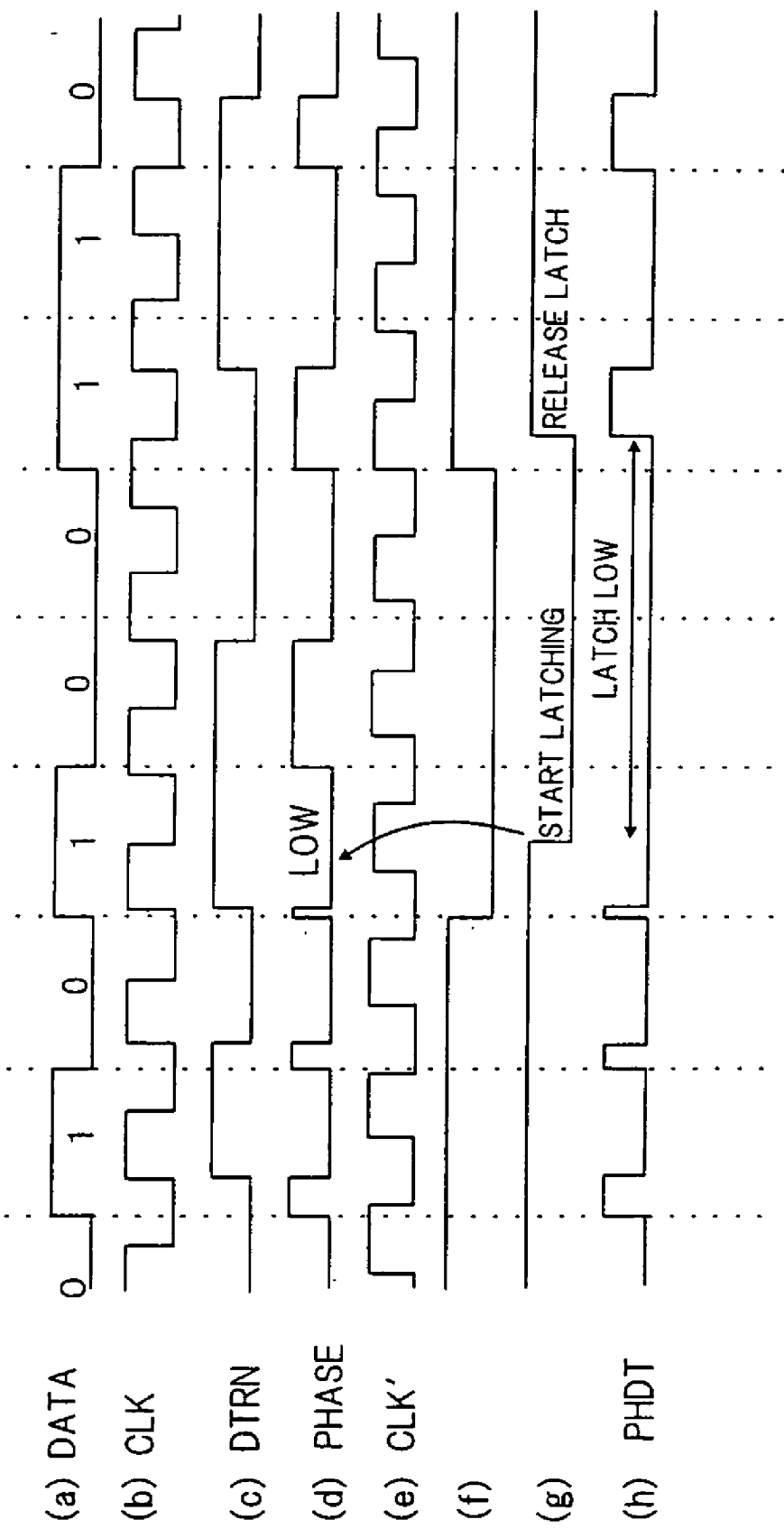

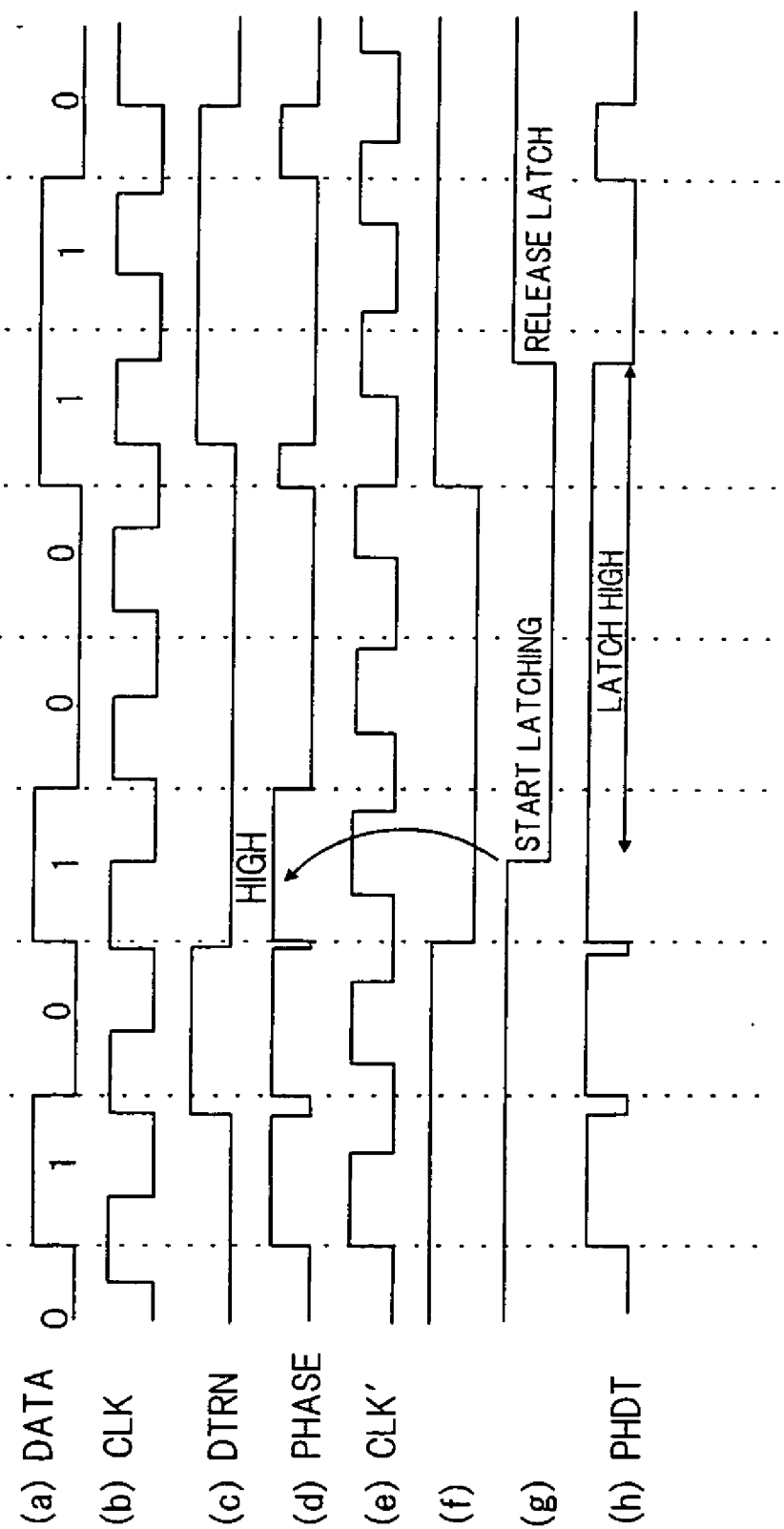

DUTY 100%

DUTY 80%
CROSS POINT  D=T*80%

DUTY 120%
D=T*120%

SLICING AND EXTRACTION RANGE
CENTER OF SLICING
DUTY 80% → DUTY 100%

PHASE (PHASE DELAY OF CLOCK WITH
RESPECT TO DATA) θ

PHASE COMPARATOR CIRCUIT

BACKGROUND OF THE INVENTION

This invention relates to a phase comparator circuit and, more particularly, to a phase comparator circuit capable of controlling phase in such a manner that a phase difference between a clock signal and a data signal takes on a prescribed value even in a case where the duty of the data signal has shifted from 100%.

In order to convert a data waveform distorted or rendered noisy by transmission to a clean digital signal in a light receiving circuit, the data signal is regenerated. At such time a clock signal is extracted from the data signal and the data signal is regenerated by a data decision circuit using the clock signal. The PLL technique is one example of means for extracting the clock signal. The PLL technique uses a phase comparator circuit, which detects the phase difference between data and a clock, and a VCO (voltage-controlled oscillator). The present invention relates to the phase comparator circuit used in this PLL arrangement.

Since a received data waveform is such that there is very little margin for decision owing to noise and distortion, it is required that the phase relationship between a data signal and clock signal input to the decision circuit be made to conform to an optimum decision point and that it not fluctuate.

FIG. 29 is a block diagram showing an example of the construction of an optical receiver in an optical communications system. The optical receiver includes a photoelectric conversion circuit 1 for converting a light signal to an electric signal, an amplifier 2 for amplifying a 10-Gbps data signal, for example, which is output by the photoelectric conversion circuit 1, an equalizer circuit 3 for equalization of the electric signal waveform, a timing extraction circuit 4 for extracting a clock signal, which has a frequency the same as that of the bit rate, from the data signal that has been equalized, and a decision circuit 5 for discriminating the data signal using the clock signal output by the timing extraction circuit 4. In an optical receiver of this kind, it is required that the phase relationship between the data signal and clock signal input to the decision circuit 5 be held at an optimum point. If this phase relationship shifts owing to a change in ambient temperature or fluctuation in power-supply voltage, discrimination can no longer be performed correctly.

Two schemes are available for the timing extraction circuit of the optical receiver that generates the clock signal. These are (1) a non-linear extraction approach using a narrow bandpass filter (see FIG. 30) and (2) a PLL technique (see FIG. 32) using a phase comparator circuit and a VCO.

FIG. 30 is a block diagram showing the construction of a timing extraction circuit using non-linear extraction. This arrangement includes a non-linear extraction circuit 110 for sensing rising and falling edges of an entered data signal, a narrow bandpass filter 111 having a center frequency the same as the bit rate of the data, and a limiter amplifier 112, which is a narrow-band amplifier. The non-linear circuit 110 has a branching circuit 110a for branching the data signal in two directions, a delay circuit 110b for delaying, by a prescribed length of time (one-half of the time that corresponds to one bit), one of the branched data signals, and an EX-OR (exclusive-OR) circuit 110c for taking the exclusive-OR between the data signal and the output signal of the delay circuit to generate an edge signal having pulses at the rising and falling edges of the data signal. FIG. 31 is a waveform diagram illustrating operation of this circuitry. The EX-OR circuit 100c senses the rising and falling edges of the data signal to generate pulses P1, the bandpass filter 111 extracts the clock component, which has a frequency identical with that of the data bit rate, from the output of the EX-OR circuit, and the limiter amplifier 112 amplifies the clock component to a fixed amplitude.

With the non-linear extraction method, a SAW filter or dielectric filter is used as the narrow bandpass filter 111. However, problems of size arise in regard to designing integrated circuits or the like, and it is difficult to reduce the size of the optical transceiver module.

Although the limiter amplifier 112 is used as means for dealing with the fact that the extracted clock component is small, that it is necessary to compensate for filtering loss and that it is required to suppress a fluctuation in the amplitude of the clock with respect to a change in the pattern of the data signal, a problem is that the fluctuation in the phase of this circuit is large.

In comparison with the non-linear extraction scheme, the PLL scheme makes it possible to incorporate almost all of the circuitry, inclusive of the VCO, on an IC chip, as a result of which the device can be made very small. In addition, even if a fluctuation in phase arises, this fluctuation is sensed by the phase comparator circuit and therefore the fluctuation in phase is compensated for by the PLL. FIG. 32 is a basic block diagram of a timing extraction circuit that employs a PLL. Numeral 4 denotes the timing extraction circuit and numeral 5 the decision circuit. The timing extraction circuit 4 includes a phase comparator circuit 121 for comparing the phases of a data signal DATA and clock signal CLK, a loop filter 122 for smoothing a voltage signal that conforms to a phase-difference signal output by the phase comparator circuit 121, and a VCO circuit 123 for generating the clock signal CLK having a frequency conforming to the output of the loop filter 122. A variety of phase comparator circuits that sense the phase difference between data and clock signals have been devised. FIG. 33 illustrates the basic portion of a phase comparator circuit that uses a D-type flip-flop (D-FF) 131 and an EX-OR circuit 132 (see IEEE Transactions on Electron Devices VOL. ED-32, No. 12 December 1985 "A Self-Correcting Clock Recovery Circuit", Hogge, pp. 2704–2706). FIG. 34 is a timechart associated with this circuit.

The flip-flop 131 outputs a data discrimination signal DTRN, which indicates the level of the data signal DATA at the moment the clock signal CLK rises. More specifically, the flip-flop 131 stores and outputs the level ("1" or "0") of the data signal DATA, which is input to the data input terminal (the D terminal), at a rising edge of the clock signal CLK input to the clock input terminal (the C terminal) and holds this level until the next rising edge of the clock signal. The EX-OR circuit 132 outputs the exclusive-OR data of the data signal DATA and the data discrimination signal DTRN output by the flip-flop 131 and outputs the result as a phase-difference signal PHASE indicative of the phase difference between the data signal and the clock signal.

It will be understood from FIG. 34 that the width of the output pulse PHASE from EX-OR circuit 132 is decided by a delay time extending from the rising or falling edge of the data signal DATA to the following rising edge of the clock signal CLK. Consequently, the average value of the signal PHASE takes on a value that conforms to the phase difference between the data signal DATA and the clock signal CLK. Let "0" and "1" represent the low and high levels, respectively, of the output signal PHASE of the EX-OR circuit 132. If the input data is random and the mark rate which is rate of "1" is ½, the phase comparison characteristic of the phase comparator circuit becomes a sawtooth waveform characteristic with respect to phase θ when the average value of the phase difference signal PHASE is between 0 and 0.5.

In order to make the phase of the data signal DATA and clock signal CLK equal to a prescribed value φ, the PLL-type timing extraction circuit 4 (FIG. 32) performs control in such a manner that the output of the phase comparator circuit 121 will be rendered constant (=S). In order for the PLL to stabilize at the phase φ, control is carried out to advance the phase of the clock signal, i.e., to raise the frequency of the VCO circuit 123, if the phase of the clock signal is greater than φ with respect to the data signal (if the phase thereof is lagging). Control is carried out to retard the phase of the clock signal, i.e., to lower the frequency of the VCO circuit 123, if the phase of the clock signal is less than φ with respect to the data signal (if the phase thereof is leading). More specifically, if the PLL is constructed using the phase comparator circuit 121 having the phase comparator characteristic of FIG. 35 so as to raise the frequency of the VCO circuit 123 when the average value of the phase-difference signal is larger than the set level S (when phase is lagging) and so as to lower the frequency of the VCO circuit 123 when the average value of the phase-difference signal is less than the set level S (when phase is leading), then the phase difference between the data signal and the clock signal can be set to any phase φ of between 0 and 2π.

If the duty of the data signal shifts from 100% in the conventional phase comparator circuit, there are instances where the PLL is locked to a different phase. The duty referred to here is the ratio between the duration T1 of data "1" and T, where f (=1/T) is the bit rate.

If in regard to phases of 0 to 2π in one period the phase comparison characteristic of the phase comparator circuit has a plurality of slopes in the same direction with respect to a change in phase and a plurality of phases for which the average values are identical exist, then it is possible that the PLL will lock with respect to any of these plurality of phases, making it impossible to determine the phase.

If the duty is 100%, only one slope in the same direction will exist in one period, as illustrated in FIG. 35. The foregoing problem does not arise, therefore, because there is only one phase for which the average value takes on the same value. If the duty shifts from 100%, however, two slopes of the same direction will exist is one period and phases for which the average values are the same will exist. This gives rise to the problem mentioned above.

FIG. 36 is a timing chart for a case where the duty is 75%. This illustrates a change in the duty brought about by advancing the phase of the falling edge of the data signal DATA (a). For the sake of comparison, the waveform for the case where the duty is 100% is indicated by the dashed line. As long as the phase difference between the data signal DATA (a) and the clock signal CLK (b) is small, the pulse width of the phase-difference signal PHASE (d) merely differs from that of this pulse when the duty is 100%. However, if the phase difference between the data signal DATA (a) and a clock signal CLK (b') exceeds 1.5π (75% of one period), the pulse that was produced by the falling edge of the data signal vanishes. As a consequence, the sawtooth phase comparison characteristic has two stages in one period (=2π), as indicated by the solid line in FIG. 37. If, in order to set the phase difference between the data and clock to φ1, control is performed in such a manner that the average value of the phase-difference signal becomes V1, there is a possibility that the PLL will synchronize at the phase of φ2 in addition to the phase of φ1 and, hence, it will no longer be possible to determine the phase. In general, the phase difference at which the phase comparison characteristic becomes discontinuous is 2π·(d/100), where d(%) represents the duty.

The foregoing is for a case where the duty falls below 100%. If the duty exceeds 100%, the sawtooth phase comparison characteristic becomes as shown by the solid line in FIG. 38, where it is seen that the characteristic takes on two stages in one period (=2π) in this instance as well. FIG. 38 is for a case where the duty is 125%. Here the phase difference at which the phase comparison characteristic becomes discontinuous is 2π·(d/100), where the duty is represented by (100+d)(%). If the duty is 125%, the point of discontinuity is π/2.

SUMMARY OF THE INVENTION

Accordingly, an object of the present invention is to arrange it so that a PLL circuit will not lock on the wrong phase (i.e., will not become incorrectly synchronized) in the event that the duty of a data signal shifts from 100%.

Another object of the present invention is to provide a phase comparator circuit so adapted that a PLL circuit will not lock on the wrong phase (i.e., will not become incorrectly synchronized).

A further object of the present invention is to equip a phase comparator circuit with a frequency comparison function in addition to a phase comparison function, to enlarge the synchronizing range of a PLL circuit and to shorten the time needed for synchronization.

In accordance with a first aspect of the present invention, the foregoing objects are attained by providing a phase comparator circuit comprising (1) a data discriminator to which a data signal is input for discriminating the data signal using a clock signal, (2) a logic circuit for outputting the exclusive-OR data of the data signal and a data discrimination signal output by the data discriminator, and inputting the result of the exclusive-OR to a clock generator as a phase-difference signal representing the phase difference between the data signal and the clock signal, (3) an erroneous-synchronization phase detector for detecting whether the phase difference between the data signal and the clock signal resides within a range of phases for which there is a possibility of erroneous synchronization, and (4) a output fixing unit for outputting the phase-difference signal if the phase difference falls outside the range of phases and outputting a fixed value if the phase difference resides within the range of phases. If this arrangement is adopted, slopes having the same direction can be made just one in one period of the phase comparison characteristic. Consequently, phases for which the average values of the phase-difference signals are the same can be made just one in one period, thereby eliminating erroneous synchronization in which a PLL circuit is locked to a phase other than a target phase.

In accordance with a second aspect of the present invention, the foregoing objects are attained by providing a phase comparator circuit comprising (1) a data discriminator to which a data signal is input for discriminating the data signal using a clock signal, (2) a logic circuit for outputting the exclusive-OR data of a data signal and a data discrimination signal output by the data discriminator, and inputting the result of the exclusive-OR to a clock generator as a phase-difference signal representing the phase difference between the data signal and the clock signal, and (3) a phase modulation circuit for modulating phase of the clock signal, wherein the data discriminator discriminates the data signal using the clock signal whose phase has been modulated by the phase modulation circuit. Even if duty shifts from 100%, slopes having the same direction can be made just one in one period by smoothly varying a sudden discontinuity in the phase comparison characteristic. As a result, phases for which the average values of the phase-difference signals are the same can be made just one in one period, thereby eliminating erroneous synchronization in which a PLL circuit is locked to a phase other than a target phase.

In accordance with a third aspect of the present invention, the foregoing objects are attained by providing a phase comparator circuit comprising (1) a data discriminator to which a data signal is input for discriminating the data signal using a clock signal, (2) a logic circuit for outputting the exclusive-OR data of a data signal and a data discrimination signal output by the data discriminator, and inputting the result of the exclusive-OR to a clock generator as a phase-difference signal representing the phase difference between the data signal and the clock signal, (3) an erroneous-synchronization phase detector for detecting whether the phase difference between the data signal and the clock signal resides within a range of phases for which there is a possibility of erroneous synchronization, and (4) an output fixing unit for (a) outputting the phase-difference signal if the phase difference between the data signal and the clock signal falls outside the range of phases, (b) outputting a first set value if the phase difference resides within the range of phases and is varying in an increasing direction, and (c) outputting a second value if the phase difference resides within the range of phases and is varying in a decreasing direction. This arrangement is such that even if duty shifts from 100%, slopes having the same direction can be made just one in one period of the phase comparison characteristic. As a result, phases for which the average values of the phase-difference signals are the same can be made just one in one period, thereby eliminating erroneous synchronization in which a PLL circuit is locked to a phase other than a target phase. This is similar to the effects of the first embodiment. In addition, if the phase difference is varying in an increasing direction, i.e., if the clock frequency is less than the data frequency, the phase-difference signal is fixed at a first set value (the high level). If the phase difference is varying in a decreasing direction, i.e., if the clock frequency is greater than the data frequency, the phase-difference signal is fixed at a second set value (the low level). As a result, the average value of the phase-difference signal increases if the clock frequency is low and decreases if the clock frequency is high. This makes it possible for the PLL circuit to recognize the synchronization pull-in direction in dependence upon the magnitude of the average value and to pull the clock frequency into the prescribed frequency in a short period of time. In other words, the synchronization pull-in range of the PLL circuit can be enlarged and pull-in time can be shortened.

Further, a data signal that has passed through a duty compensation circuit which compensates duty is adopted as the data signal of the phase comparator circuit according to the first to third aspects of the present invention. If this arrangement is adopted, it is possible to enlarge the range of duty variation capable of being dealt with by the phase comparator circuit. Moreover, the phase comparator circuit has only to act on the duty deviation from 100% which the duty compensation circuit cannot compensate, and therefore the range of erroneous synchronization phases can be reduced to enable enlargement of the range over which phase can be controlled.

A further object of the present invention is to enlarge the range of duty variation capable of being handled.

Other features and advantages of the present invention will be apparent from the following description taken in conjunction with the accompanying drawings.

BRIEF DESCRIPTION OF THE DRAWINGS

FIG. 1 is a diagram showing the principle of a phase comparator circuit according to a first aspect of the present invention;

FIG. 16 is a timing chart associated with the phase comparator circuit of the third aspect of the present invention (where clock frequency is higher than data frequency);

FIG. 17 is a timing chart associated with the phase comparator circuit of the third aspect of the present invention (where clock frequency is lower than data frequency);

DESCRIPTION OF THE PREFERRED EMBODIMENTS (A) First Phase Comparator Circuit of the Present Invention (a) Principle and Construction FIG. 1 is a block diagram for describing the principle of a first phase comparator circuit according to the present invention. The phase comparator circuit includes a data discriminator [a D-type flip-flop (D-FF)] 11, to which a data signal DATA is applied, for discriminating the level of the data signal in sync with the rising edge of a clock signal CLK, and an EX-OR circuit 12 for outputting the exclusive-OR data of the data signal DATA and a data discrimination signal DTRN output by the data discriminator 11 and outputting the result as a phase-difference signal PHASE. The flip-flop 11 and the EX-OR circuit 12 construct the conventional phase comparator circuit shown in FIG. 33.

The phase comparator circuit further includes an erroneous-synchronization phase detector 13 for detecting whether the phase difference between the data signal DATA and the clock signal CLK resides within a range of phases for which there is a possibility of erroneous synchronization, and outputting an erroneous-synchronization phase signal ESPD if the phase difference resides with the above-mentioned range, and an output fixing circuit 14 for outputting a phase detection signal PHDT. Specifically, the output fixing circuit 14 (1) outputs the phase-difference signal PHASE if the phase difference falls outside the range of phases and (2) outputs a fixed value if the phase difference resides within the range of phases.

Figure 2A:
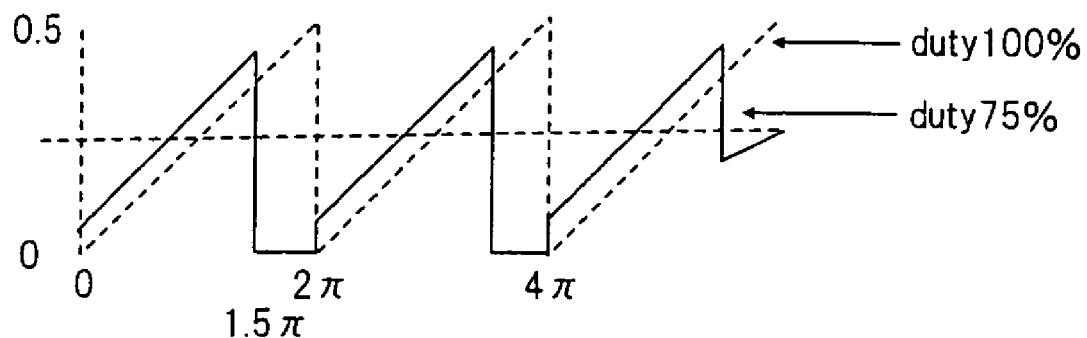
FIGS. 2A and 2B show phase comparison characteristics associated with the phase comparator circuit of the first aspect of the present invention.
Figure 2B:
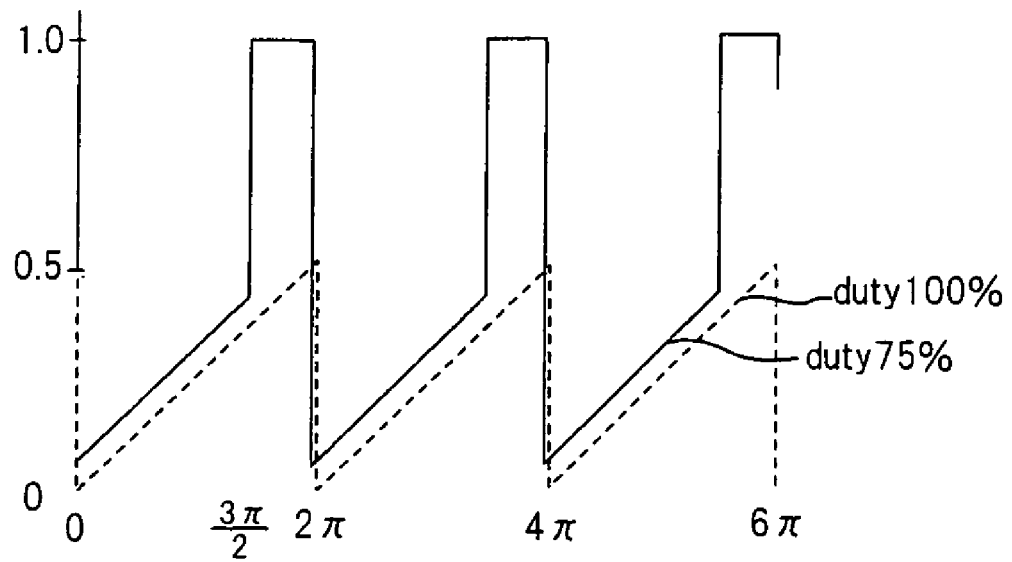
Figure 37:
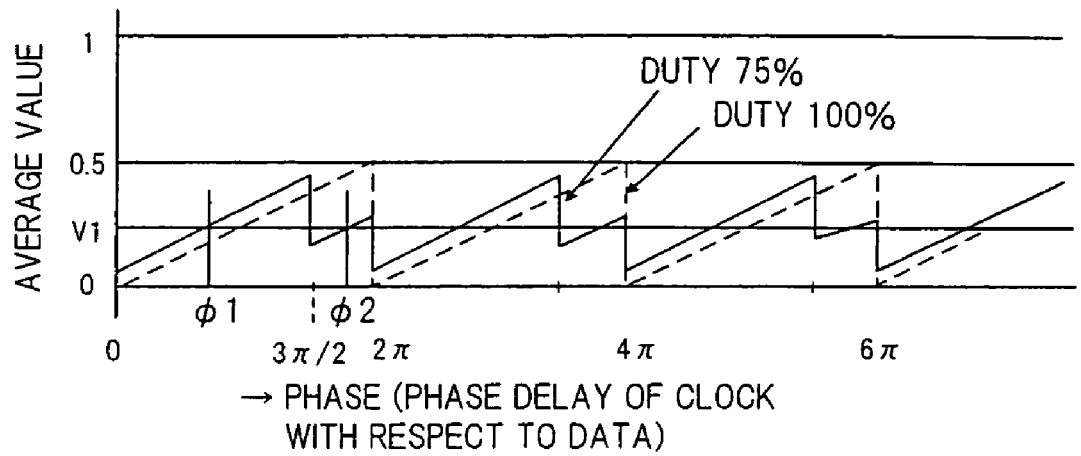
FIG. 37 shows the phase comparison characteristic of the phase comparator circuit according to the prior art (where duty is 75%)
Figure 38:
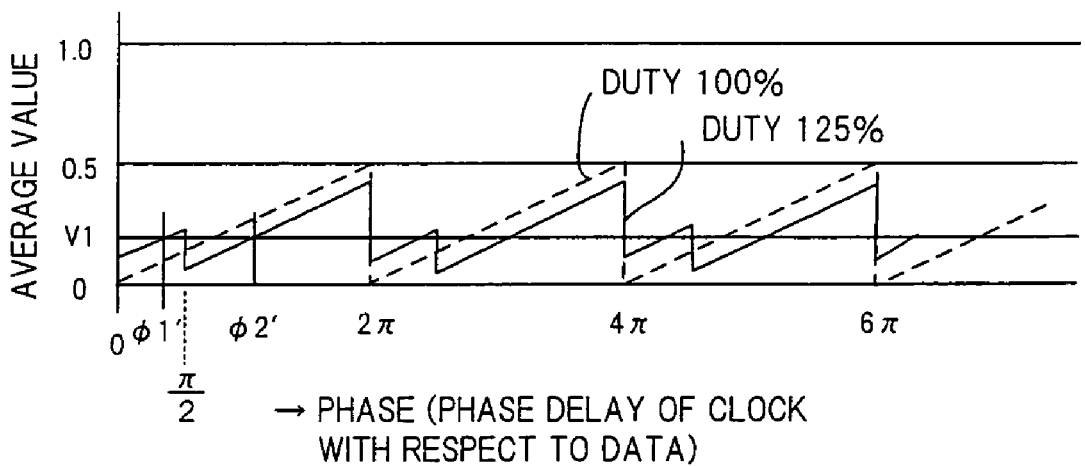
FIG. 38 shows the phase comparison characteristic of the phase comparator circuit according to the prior art (where duty is 125%).

If the duty of the data signal DATA is d(%) (where d<100 holds), the range of phases for which there is a possibility of erroneous synchronization is 2π·(d/100) to 2π, as apparent from FIG. 37. If the duty is (100+d) (%), the range of phases for which there is a possibility of erroneous synchronization is 0 to 2π·(d/100), as apparent from FIG. 38. The erroneous-synchronization phase detector 13 detects that the phase difference falls within the above-mentioned range and outputs a low-level signal as the erroneous-synchronization phase signal ESPD. When the phase difference is outside the range of erroneous synchronization phases and the erroneous-synchronization phase signal ESPD is at a high level, the output fixing circuit 14 delivers the phase-difference signal PHASE output by the EX-OR circuit 12. When the phase difference falls within the range of erroneous synchronization phases and the erroneous-synchronization phase signal ESPD is at the low level, the output fixing circuit 14 outputs a fixed signal instead of the phase-difference signal PHASE. FIG. 2 shows the phase characteristics of the average value of the phase detection signal PHDT output by the output fixing circuit 14 in a case where the duty is 75%. FIG. 2A shows the characteristic in a case where the fixed value is made a low-level signal, and FIG. 2B shows the characteristic in a case where the fixed value is made a high-level signal. Since d=75% in FIGS. 2A and 2B, 3π/2 to 2π is the range of phases in which erroneous synchronization is possible.

If this arrangement is adopted, there will not be two or more slopes of identical direction even if duty shifts from 100%. Consequently, two or more phases having the same average value will not reside in one period and erroneous synchronization can be prevented as a result.

(b) Embodiment

Figure 3:
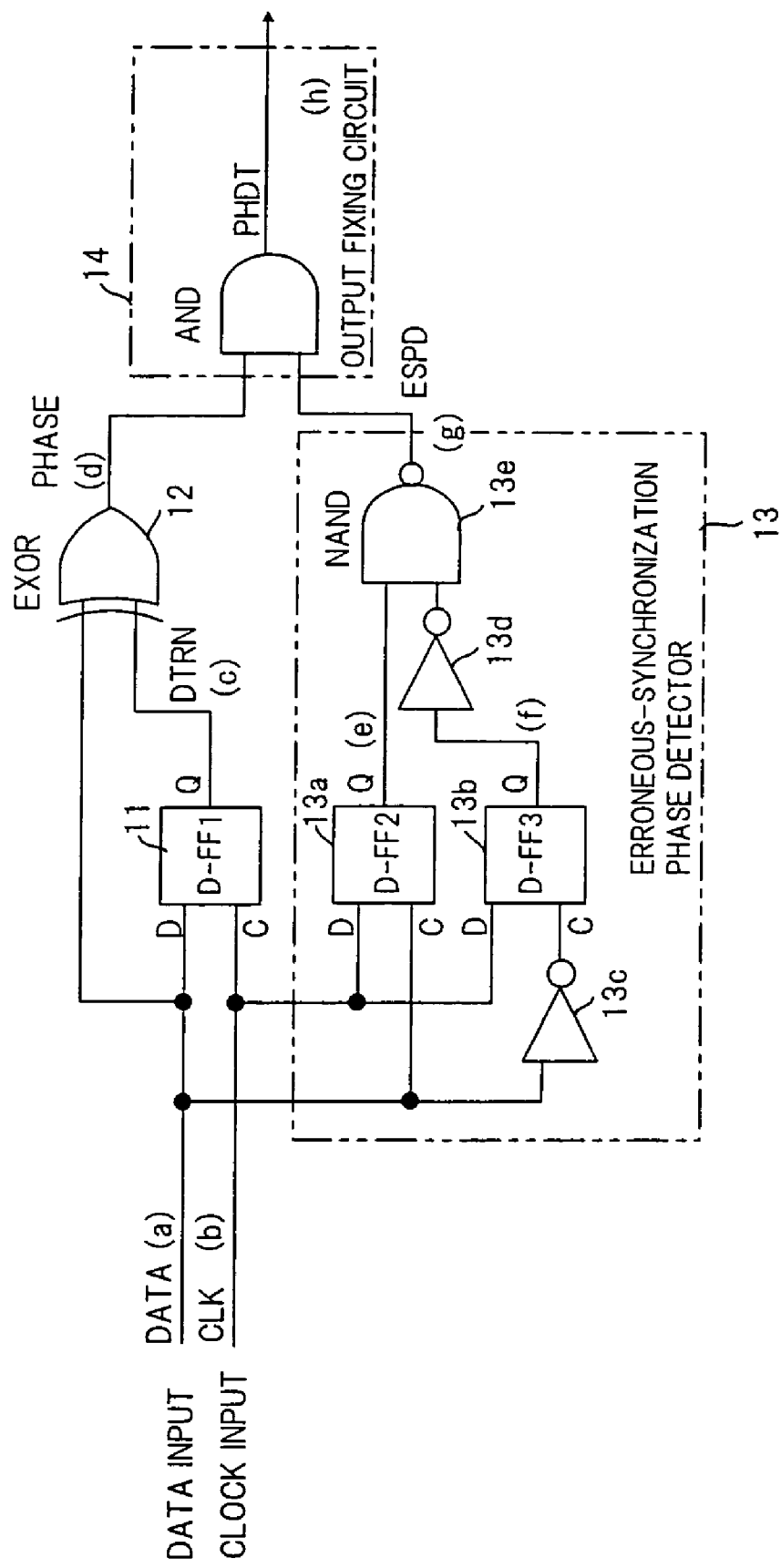
FIG. 3 is a block diagram showing the phase comparator circuit (where d<100% holds) according to the first aspect of the present invention.

FIG. 3 is a block diagram showing a phase comparator circuit according to an embodiment of a first aspect of the present invention. Components in FIG. 3 identical with those shown in FIG. 1 are designated by like reference characters. The circuit includes a first D-type flip-flop (D-FF1) 11, the EX-OR circuit 12, the erroneous-synchronization phase detector 13 for when the duty of the data signal DATA is less than 100%, and the output fixing circuit 14, which is constituted by an AND gate AND.

The erroneous-synchronization phase detector 13 includes second and third D-type flip-flops (D-FF2, D-FF3), inverting circuits 13c, 13d and a NAND gate 13e. The D-FF2 discriminates the level of the clock signal CLK at the rising edge of the data signal DATA, and the D-FF3 discriminates the level of the clock signal CLK at the falling edge of the data signal DATA.

Erroneous synchronization which occurs when the duty of the data signal DATA is less than 100% happens in a case where a rising edge of the clock signal CLK exists at a "1" portion of the data signal where the pulse width thereof narrows to such an extent that the pulse vanishes, as will be understood. The wording a "case where a rising edge of the clock signal CLK exists at a "1" portion of the data signal where the pulse width thereof narrows to such an extent that the pulse vanishes" means a case where (1) the clock signal level is high at the rising edge of the data signal DATA and (2) the clock signal level is low at the falling edge of the data signal DATA.

Accordingly, if the conditions (1), (2) mentioned above are detected by the D-FF2 and D-FF3 and the output level of the phase detection signal PHDT is fixed at a prescribed value, erroneous synchronization can be prevented. That is, if condition (1) is detected by the D-FF2, condition (2) is detected by the D-FF3 and the AND of these two detected conditions is taken, then a state in which there is a possibility of erroneous synchronization can be detected. Since the output signal ESPD of NAND gate 13e is at the low level at this time, output of the phase-difference signal PHASE is blocked by the AND gate AND of output fixing circuit 14 and the phase detection signal PHDT fixed at the low level is output to eliminate the possibility of erroneous synchronization.

Figure 4A:
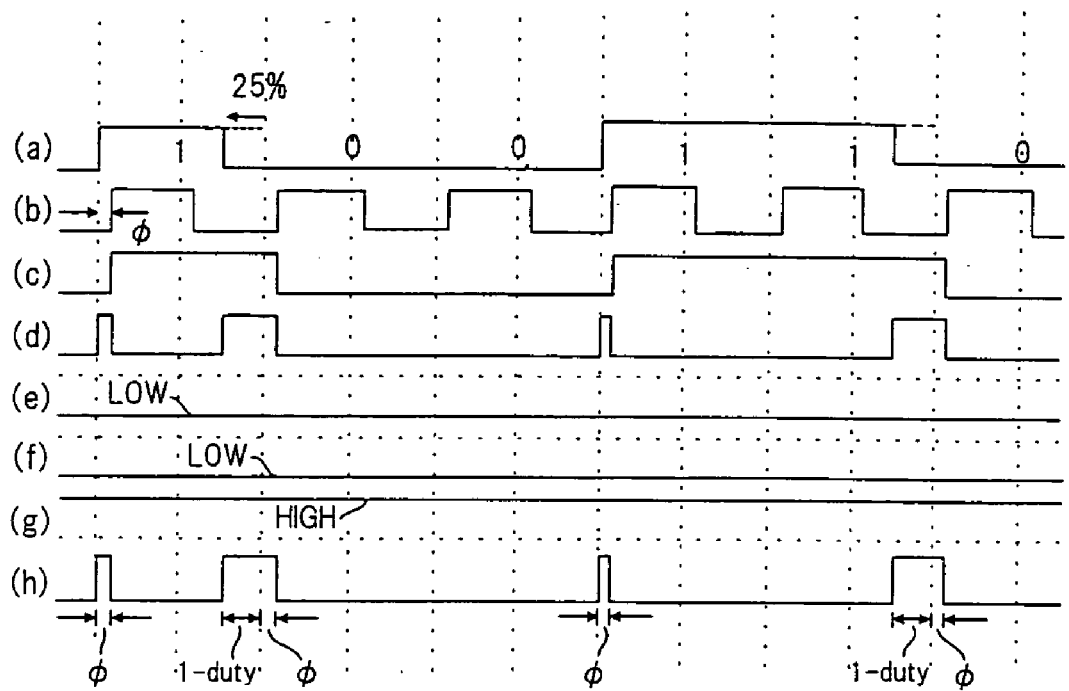
FIGS. 4A and 4B are timing charts associated with the phase comparator circuit of the first aspect of the present invention.
Figure 4B:
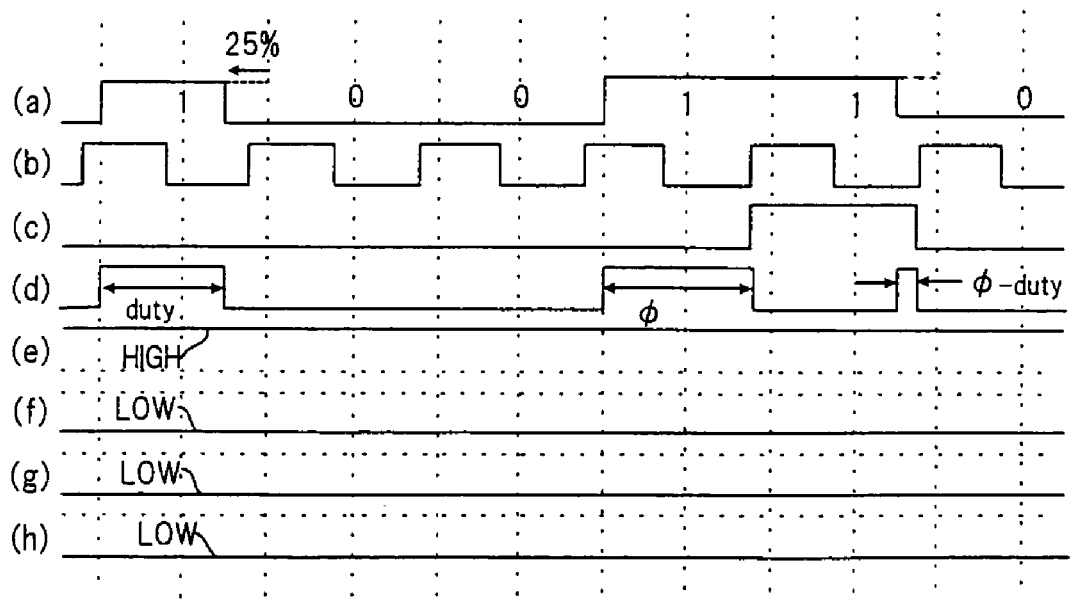

FIG. 4 shows time charts of the phase comparator circuit shown in FIG. 3. FIG. 4A is a time chart for a case where the duty d is 75% and the phase difference is 0 to $2\pi(d/100)$ (=0 to $3\pi/2$). This is a state in which the output is not held at a fixed value in the output fixing circuit 14. FIG. 4B is a time chart for a case where the duty d is 75% and the phase difference is $2\pi(d/100)$ to $2\pi(=3\pi/2$ to $2\pi)$. This is a state in which the output is fixed at the low level in the output fixing circuit 14.

Though the foregoing is for a case where the duty is less than 100%, erroneous synchronization can be prevented in a similar manner for a duty greater than 100%. That is, erroneous synchronization which occurs when the duty of the data signal DATA is greater than 100% happens in a case that is the reverse of that when the duty is less than 100%, namely in a case where (1)' the clock signal level is low at the rising edge of the data signal and (2)' the clock signal level is high at the falling edge of the data signal. When both of the conditions (1)' and (2)' have been detected, the phase detection signal PHDT is held at a fixed value to prevent erroneous synchronization.

Figure 5:
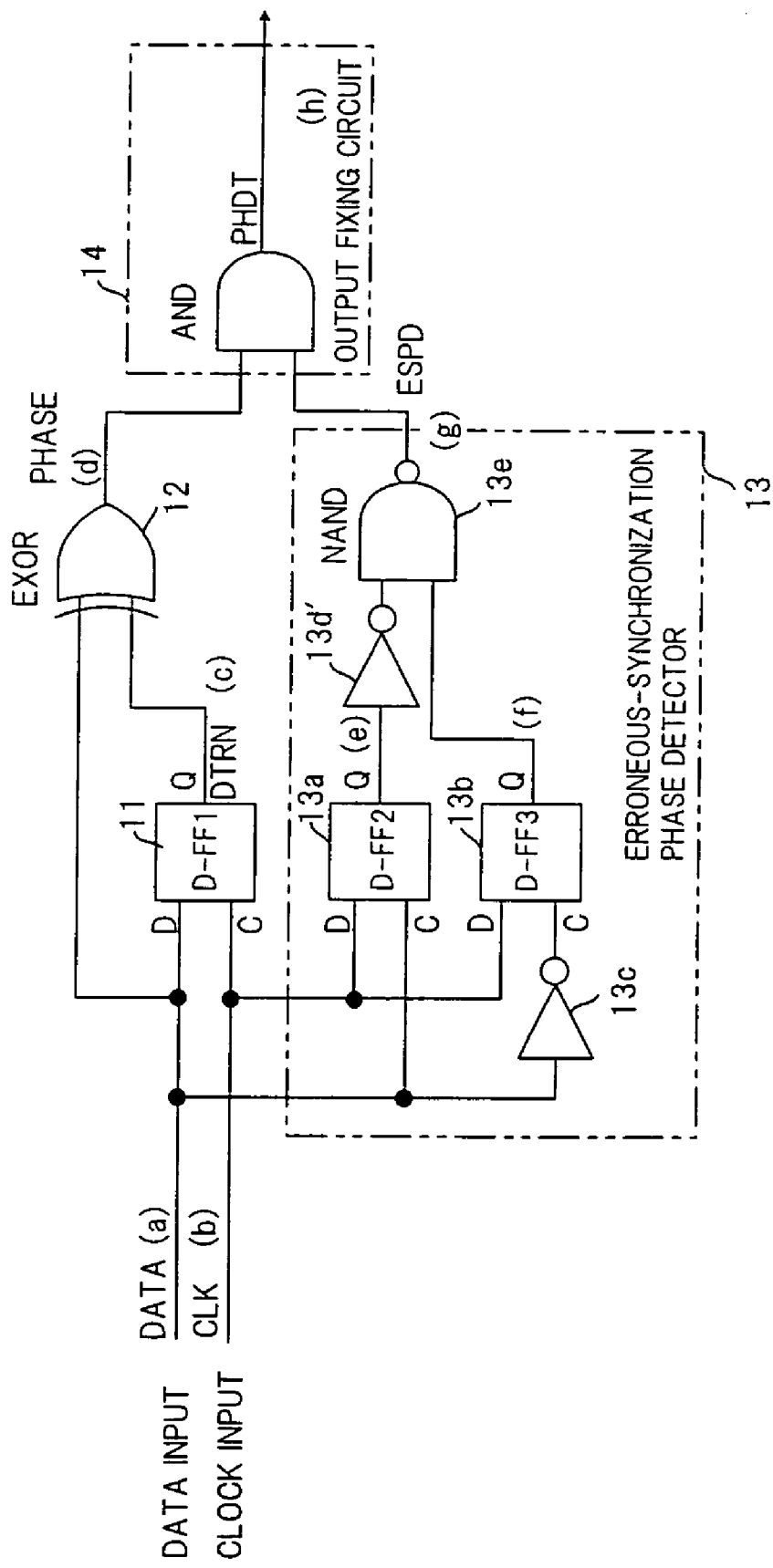
FIG. 5 is a block diagram showing the phase comparator circuit (where d>100% holds) according to the first aspect of the present invention.

FIG. 5 is a block diagram showing the phase comparator circuit in a case where the duty is greater than 100%. Components in FIG. 5 identical with those shown in FIG. 3 are designated by like reference characters. This circuit differs from that of FIG. 3 in the position of the position of the inverting circuit, which here is designated at 13d'. The condition (1)' is detected by the D-FF2 and inverting circuit 13d', the condition (2) is detected by D-FF3 and the AND of both detected conditions is taken, thereby detecting a state in which erroneous synchronization is possible. Since the output signal ESPD of NAND gate 13e is at the low level at this time, output of the phase-difference signal PHASE is blocked by the AND gate AND of output fixing circuit 14 and the phase detection signal PHDT fixed at the low level is output to eliminate the possibility of erroneous synchronization.

It should be noted that although an embodiment for a duty of less than 100% and an embodiment for a duty of greater than 100% are illustrated separately, both of these can be combined to construct the phase comparator circuit.

Thus, in accordance with the phase comparator circuit of the first aspect of the present invention, a PLL will not synchronize at the wrong phase even if the duty changes.

Figure 6:
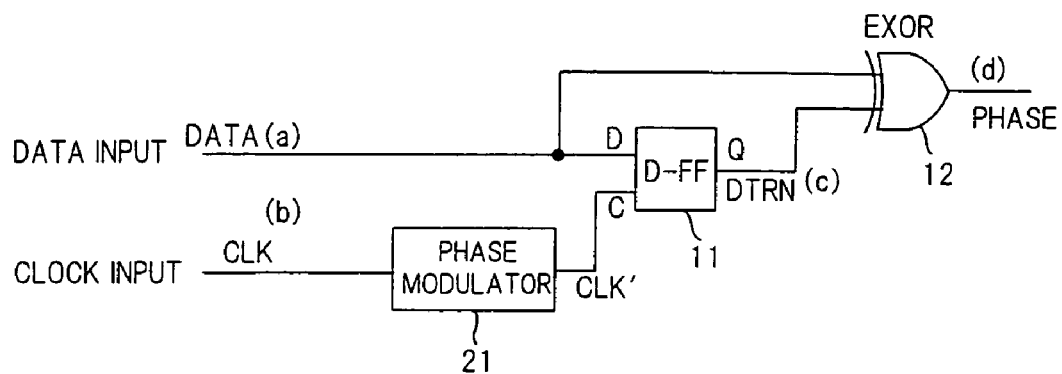
FIG. 6 is a diagram showing the principle of a phase comparator circuit according to a second aspect of the present invention.
Figure 7:
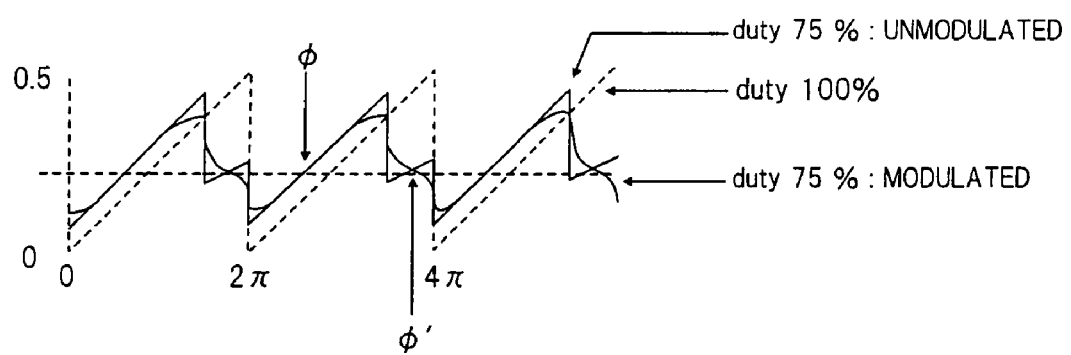
FIG. 7 shows a phase comparison characteristic associated with the phase comparator circuit of the second aspect of the present invention.
Figure 33:
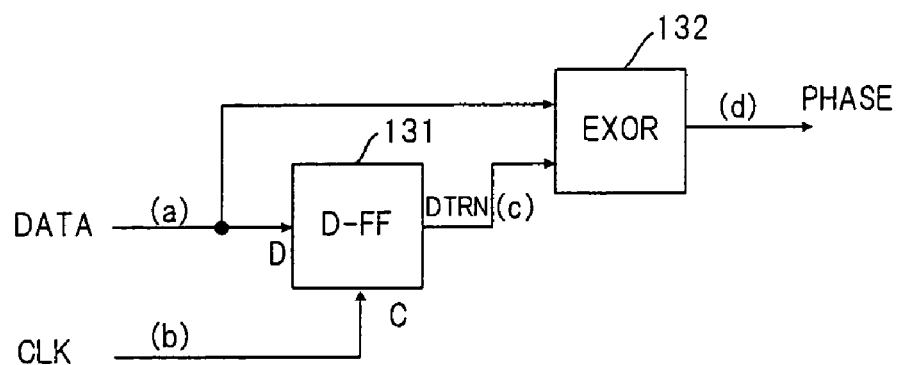
FIG. 33 is a block diagram showing a phase comparator circuit according to the prior art.
Figure 34:
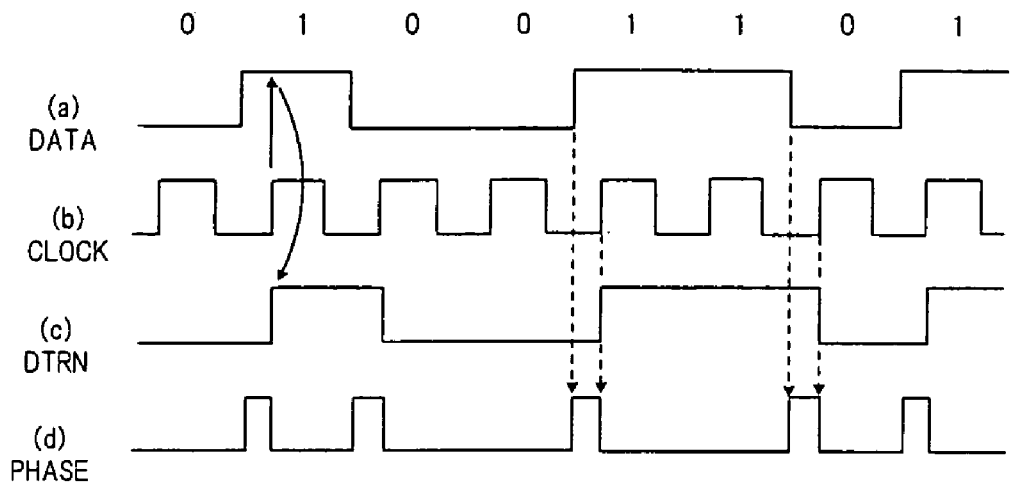
FIG. 34 is a timing chart associated with the phase comparator circuit according to the prior art.
Figure 35:
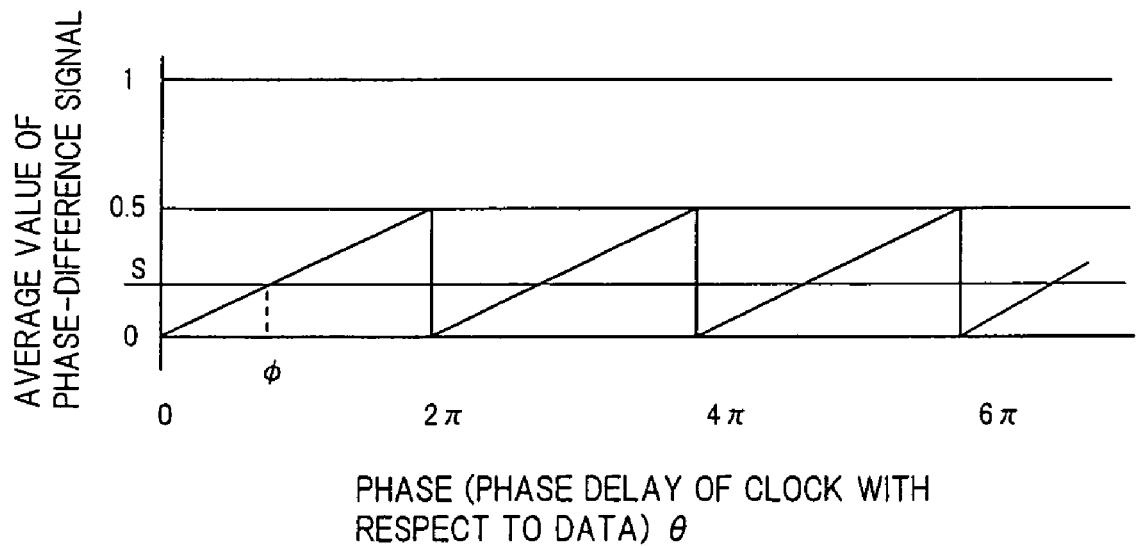
FIG. 35 shows the phase comparison characteristic of the phase comparator circuit according to the prior art.
Figure 36:
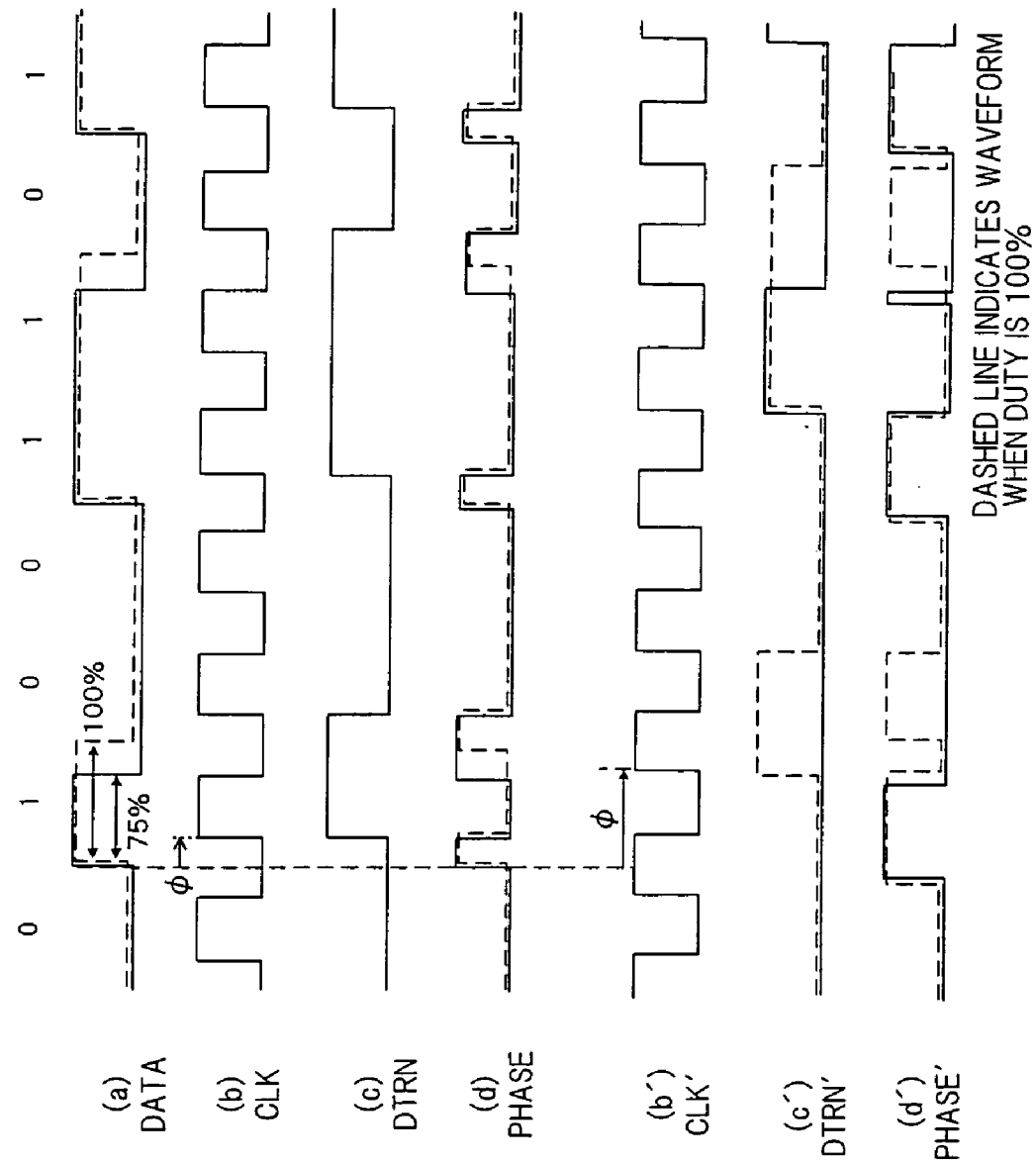
FIG. 36 is a timing chart of the phase comparator circuit according to the prior art (where duty is 75%)

(B) Second Phase Comparator Circuit of the Present Invention (a) Principle and Construction FIG. 6 is a diagram showing the principle of a phase comparator circuit according to a second aspect of the present invention. The phase comparator circuit includes the data discriminator [a D-type flip-flop (D-FF)] 11, to which the data signal DATA is applied, for discriminating the level of the data signal in sync with the rising edge of the clock signal CLK, and the EX-OR circuit 12 for outputting the exclusive-OR data of the data signal DATA and the data discrimination signal DTRN output by the data discriminator 11 and outputting the result as the phase-difference signal PHASE. The flip-flop 11 and the EX-OR circuit 12 construct the conventional phase comparator circuit shown in FIG. 33. The phase comparator circuit further includes a phase modulating circuit 21 for modulating the phase of the clock signal. The flip-flop 11 discriminates the data signal DATA using a clock signal CLK' that has been modulated in phase by the phase modulating circuit 21. When phase modulation is applied to the clock signal, the phase comparison characteristic is averaged in the phase direction in dependence upon the width of modulation, whereby the characteristic varies smoothly in the manner shown in FIG. 7. That is, a sudden discontinuity in the phase comparison characteristic is made to vary smoothly so that there will not be two or more slopes having the same direction in one period. As a result, whereas in the absence of phase modulation there is a possibility of synchronization to a phase of φ' even if it is attempted to achieve synchronization to phase φ, the slope at f' with respect to the phase direction is made the opposite of that at f when phase modulation is carried out as in the present invention. Erroneous synchronization at φ', therefore, no longer occurs.

(b) Construction of First Embodiment

Figure 8:
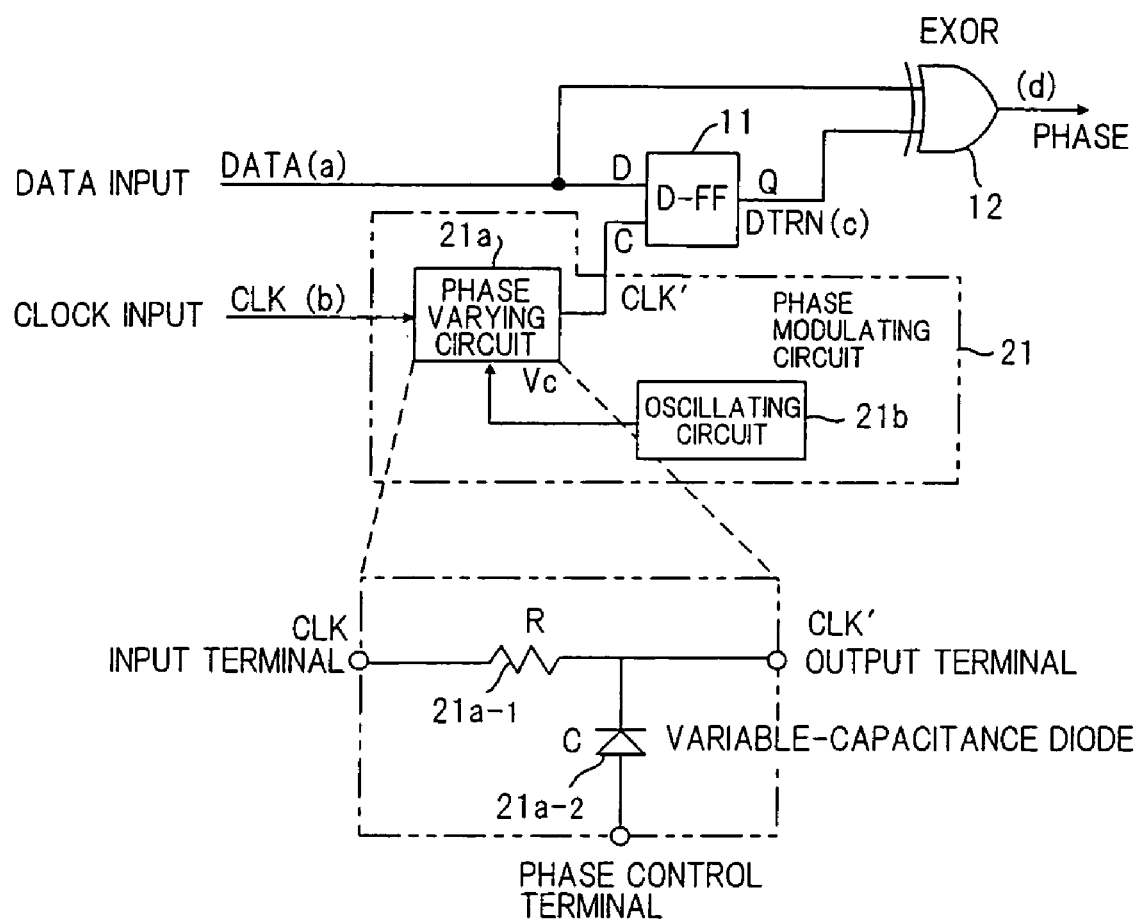
FIG. 8 is a block diagram showing the phase comparator circuit according to the second aspect of the present invention.

FIG. 8 is a block diagram showing a phase comparator circuit according to an embodiment of a second aspect of the present invention. Components in FIG. 8 identical with those shown in FIG. 6 are designated by like reference characters. The circuit includes the D-FF 11, the EX-OR circuit 12 and the phase modulating circuit 21.

The phase modulating circuit 21 includes a phase varying circuit 21a for varying the phase of the clock, and an oscillating circuit 21b for inputting a voltage signal having a prescribed frequency to a phase control terminal of the phase varying circuit 21a. The phase varying circuit 21a is constituted by a resistor 21a-1 and a variable-capacitance diode 21a-2. By varying a control voltage Vc applied to the phase control terminal of the phase varying circuit 21a, the capacitance C of the variable-capacitance diode 21a-2 is changed, thereby varying the phase of the clock signal CLK' delivered from the output terminal. The modulation frequency of the clock phase is equal to the frequency of the voltage signal Vc output from the oscillation circuit 21b.

(c) Alternative Construction of Phase Varying Circuit

Figure 9:
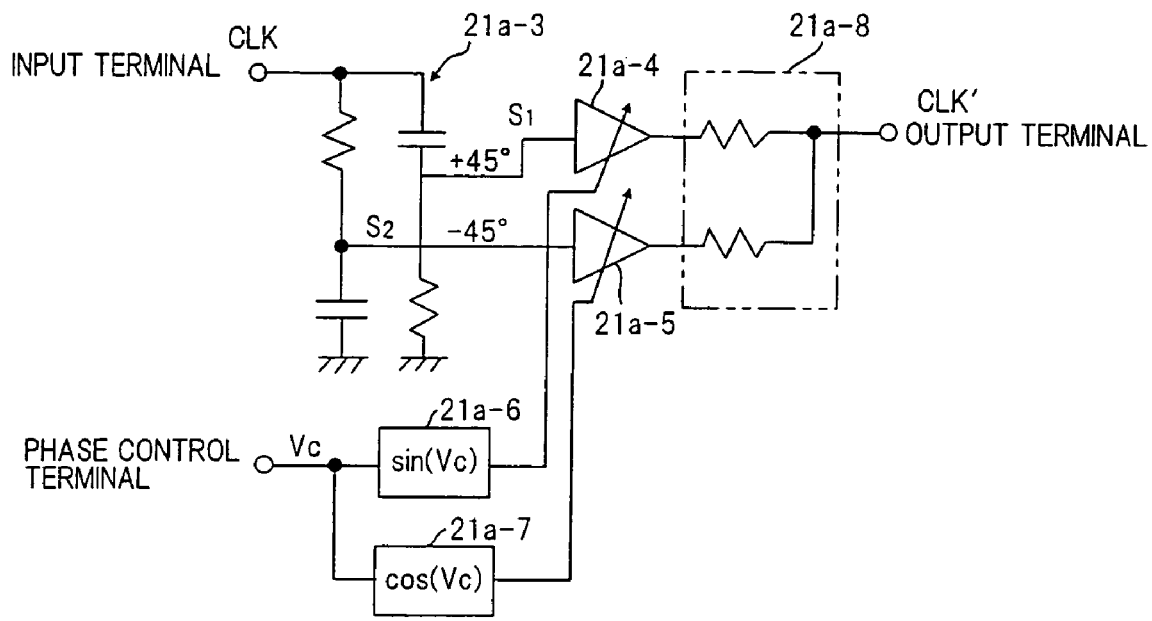
FIG. 9 is a diagram showing another example of the construction of a phase varying circuit.

FIG. 9 is a diagram showing another example of the construction of the phase varying circuit. This circuit distributes the input signal (the clock signal CLK) as two signals S1, S2 shifted in phase from each other by 90° and changes the ratio at which the two signals are combined, thereby varying the phase of the output signal (clock signal CLK'). The circuit includes a signal generator 21a-3 for generating a clock signal S1 advanced in phase by 45° and a clock signal S2 retarded in phase by 45°, variable-gain amplifiers 21a-4, 21a-5, gain control voltage generators 21a-6, 21a-7 for respectively outputting a sine value [sin(Vc)] and a cosine value [cos(Vc)] of a control voltage Vc, and a signal combiner 21a-8.

(d) Construction of Second Embodiment

Figure 10:
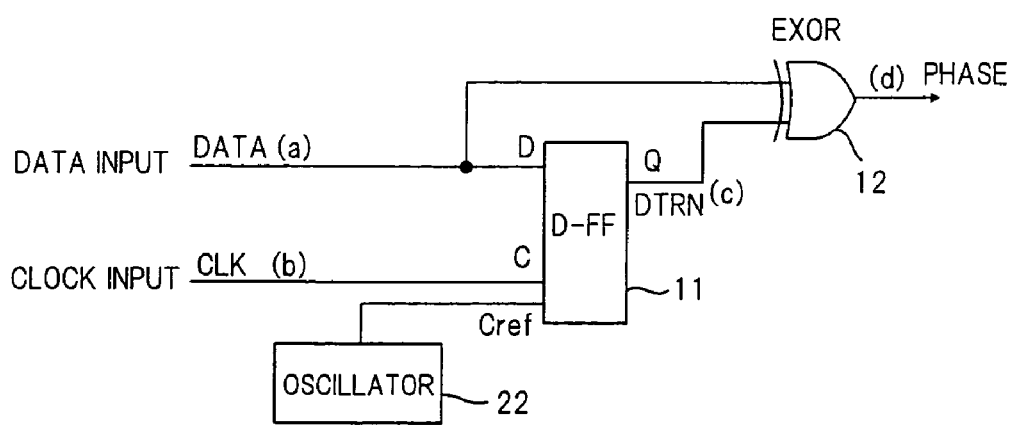
FIG. 10 is a diagram showing another example (a second embodiment) of a phase comparator circuit according to the second aspect of the present invention.
Figure 11:
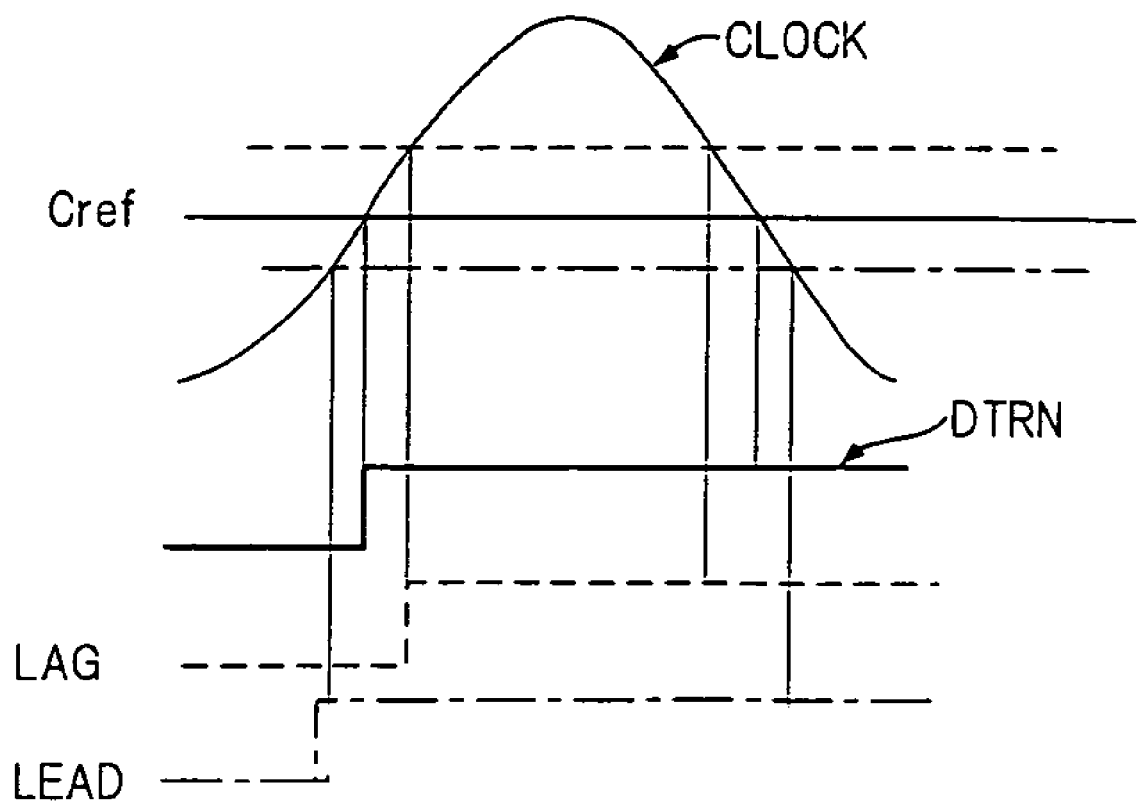
FIG. 11 is a diagram useful in describing the operation of the second embodiment.

FIG. 10 is a block diagram showing the construction of a second embodiment of phase comparator circuit according to a second aspect of the present invention. Components in FIG. 10 identical with those shown in FIG. 6 are designated by like reference characters. The circuit includes the D-FF 11, the EX-OR circuit 12 and an oscillator 22 capable of varying a cross-reference level Cref of the D-FF 11. If modulation is performed by superimposing a very small low-frequency signal upon a CLK reference terminal of the D-FF 11, the equivalent of perturbation can be applied to the phase of the clock signal CLK input to the clock input terminal C and the phase-difference signal PHASE output from the phase comparator circuit can be caused to incline smoothly as indicated by the solid line in FIG. 7. More specifically, if the clock reference level Cref is varied in the manner shown in FIG. 11, the phase of a data discrimination signal DTRN output by the D-FF is modulated (advanced/retarded). This is equivalent to modulation of the clock phase.

(C) Phase Comparator Circuit of Third Aspect of the Present Invention

(a) Overview

According to the first aspect of the present invention, the phase detection signal is held at a fixed value, namely a low or high level, if the phase difference resides within a range of phases in which erroneous synchronization is possible. This prevents erroneous synchronization from occurring. The third aspect of the present invention is so adapted that a frequency comparison is carried out in addition to a phase comparison. More specifically, according to the third aspect of the present invention, (1) if the phase difference between the data signal and the clock signal resides within a range of phases (e.g., 0 to $\pi/2$, $3\pi/2$ to $2\pi$) for which there is a possibility of erroneous synchronization and, moreover, the clock frequency is lower than the data frequency, the phase detection signal PHDT is fixed at a first set value (e.g., the high level); (2) if the phase difference between the data signal and the clock signal resides within a range of phases for which there is a possibility of erroneous synchronization and, moreover, the clock frequency is higher than the data frequency, the phase detection signal PHDT is fixed at a second set value (e.g., the low level); and (3) if the phase difference resides within a phase control range ($\pi/2$ to $3\pi/2$), the phase-difference signal is output and phase control is performed, whereby the phase difference is controlled to, e.g., $\phi$ ($=\pi$).

If the expedient described above is adopted, slopes having the same direction can be made just one in one period (0 to $2\pi$), even if the duty shifts from 100%, just as in the first aspect of the present invention. As a result, phases for which the average values of the phase-difference signals are the same can be made just one in one period, and it is possible to eliminate erroneous synchronization in which a PLL circuit is locked to a phase other than the target phase $\phi$. In addition, the average value $AV_{LF}$ of the phase detection signal PHDT increases if the clock frequency is low, and the average value $AV_{HF}$ of the phase detection signal PHDT decreases if the clock frequency is high. This makes it possible to recognize the synchronization pull-in direction in dependence upon the magnitude of the average value and to pull the clock frequency into the prescribed frequency in a short period of time. In other words, the synchronization pull-in range of the PLL circuit can be enlarged and pull-in time can be shortened.

(b) First Embodiment

Figure 13:
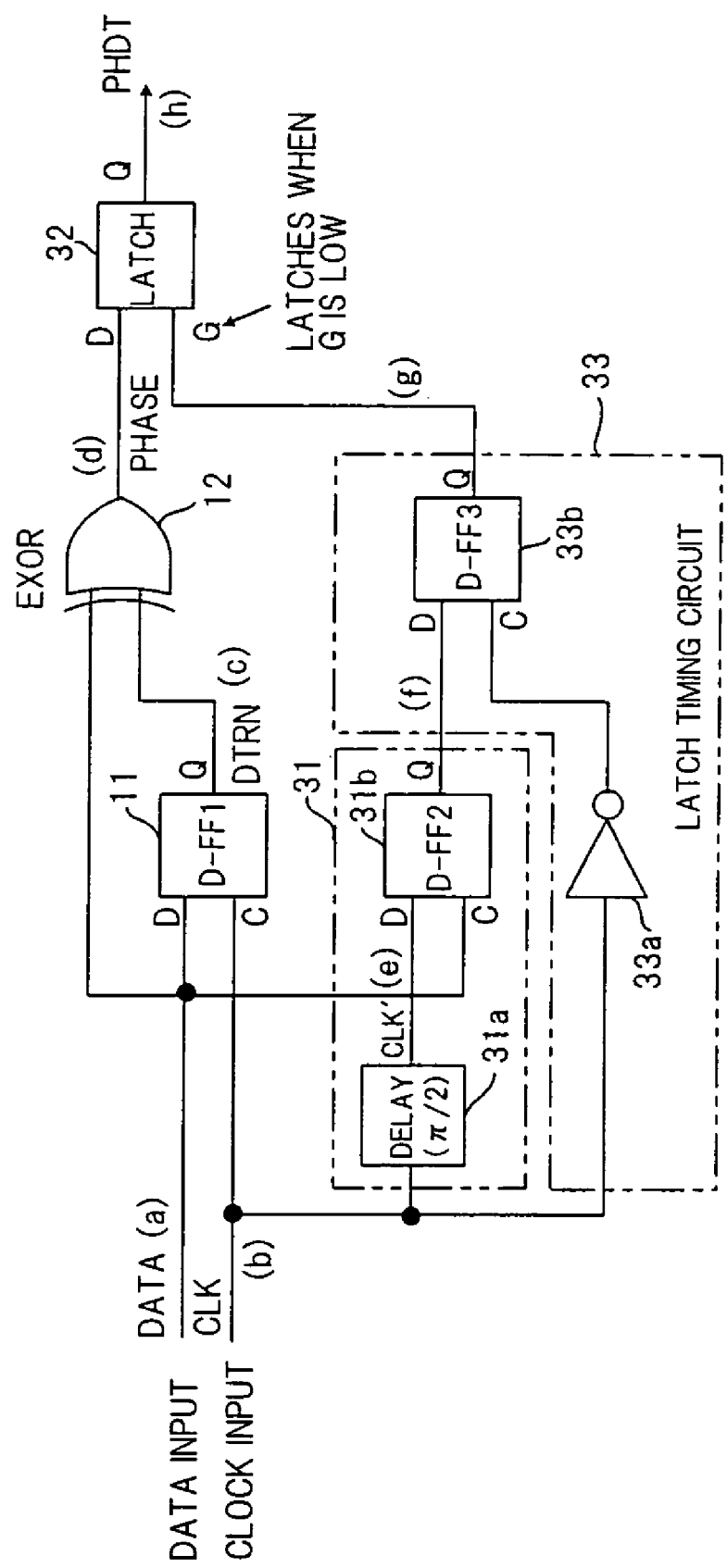
FIG. 13 is a block diagram showing a phase comparator circuit according to the third aspect of the present invention.

FIG. 13 is a block diagram showing a phase comparator circuit which is a first embodiment of the third aspect of the present invention. Components in FIG. 13 identical with those shown in FIG. 1 are designated by like reference characters. The circuit includes the first D-type flip-flop (D-FF1) 11, the EX-OR circuit 12 for outputting a signal that conforms to the phase difference between the data signal DATA and the clock signal CLK, an erroneous-synchronization phase detector 31 for detecting whether the phase difference between the data signal DATA and the clock signal CLK resides within a range of phases (0 to $\pi/2$, $3\pi/2$ to $2\pi$) for which there is a possibility of erroneous synchronization, a latch circuit 32 for outputting the phase detection signal PHDT, and a latch timing circuit 33 for deciding latch timing.

If the duty of the data signal is (100−d)(%) to (100+d)(%), then the range of phases for which there is a possibility of erroneous synchronization is $-2\pi \cdot (d/100)$ to $2\pi \cdot (d/100)$, as will be appreciated from the first aspect of the present invention. If d=25 holds, then the erroneous-synchronization phase range is $-\pi/2$ to $\pi/2$ (=0 to $\pi/2$, $3\pi/2$ to $2\pi$). Accordingly, if d= 25 holds in a case where PLL control is performed in such a manner that the phase difference becomes the center phase $\pi$, then phase control will be carried out in such a manner that the phase difference becomes the center phase $\pi$ in the range $\pi/2$ to $3\pi/2$, and the phase detection signal is held at a fixed value in the range 0 to $\pi/2$ and $3\pi/2$ to $2\pi$.

The erroneous-synchronization phase detector 31 is constituted by a delay circuit 31a for shifting the phase of the clock signal CLK by $\pi/2$, and a D-type flip-flop (D-FF2) 31b for storing the level of the clock signal CLK', which is obtained by the phase delay of $\pi/2$, at the rising edge of the data signal DATA. If the phase difference falls within the erroneous-synchronization phase range (0 to $\pi/2$, $3\pi/2$ to $2\pi$), the level of the ($\pi/2$)-phase-delayed clock CLK' at the rising edge of the data signal DATA will always be the low level. Accordingly, the fact that the phase difference resides within the erroneous-synchronization phase range can be discriminated by retaining the low level in the D-FF2.

The latch timing circuit 33 has an inverter 33a for inverting the polarity of the clock signal CLK, and a D-type flip-flop (D-FF3) for holding the output level of the D-FF2 at the timing of the falling edge of the clock signal CLK and inputting the output level to the latch circuit 32. In other words, the latch timing circuit 33 inputs the latch timing to the latch circuit 32 at the falling edge of the clock signal.

Figure 12:
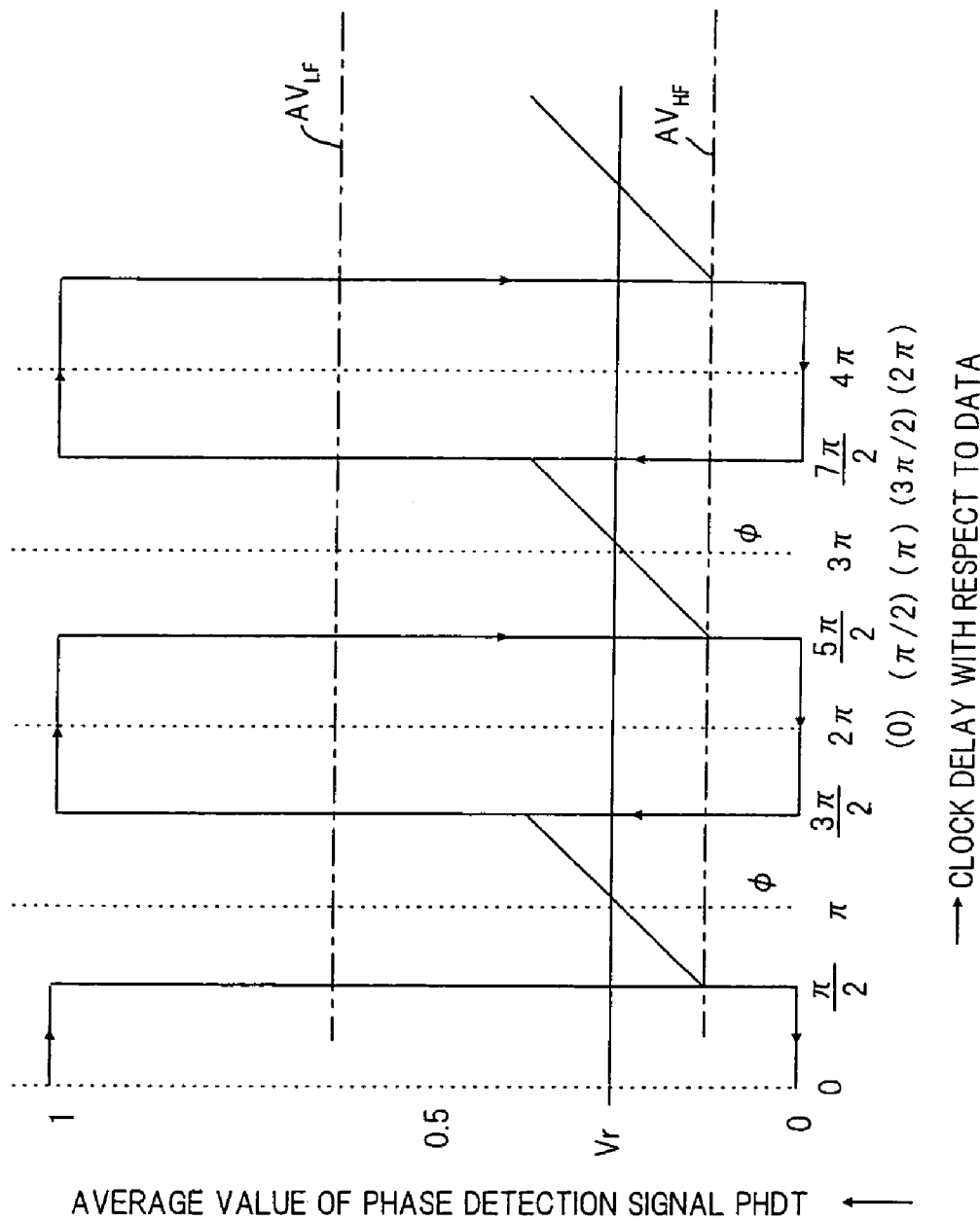
FIG. 12 is a diagram showing relationship between a phase difference and an average value of phase detection signal according to a third aspect of the present invention.

As shown in FIG. 12, the latch circuit 32 (1) outputs the phase-difference signal PHASE (d) if the phase difference between the data signal and the clock signal falls within the phase control range ($\pi/2$ to $3\pi/2$); (2) fixes the phase detection signal PHDT at a first set value (the high level) if the phase difference between the data signal and the clock signal falls within the erroneous-synchronization phase range (0 to $\pi/2$, $3\pi/2$ to $2\pi$) and, moreover, the phase difference is varying in an increasing direction (i.e., when the frequency of the clock signal is lower than that of the data signal); and (3) fixes the phase detection signal PHDT at a second set value (the low level) if the phase difference between the data signal and the clock signal falls within the above-mentioned erroneous-synchronization phase range and, moreover, the phase difference is varying in a decreasing direction (i.e., when the frequency of the clock signal is higher than that of the data signal). It should be noted that if the output level of the D-FF2 at the falling edge of the clock signal CLK is the high level, the latch circuit 32 releases the latch and delivers the phase-difference signal PHASE (d) output by the EX-OR circuit 12.

Figure 14:
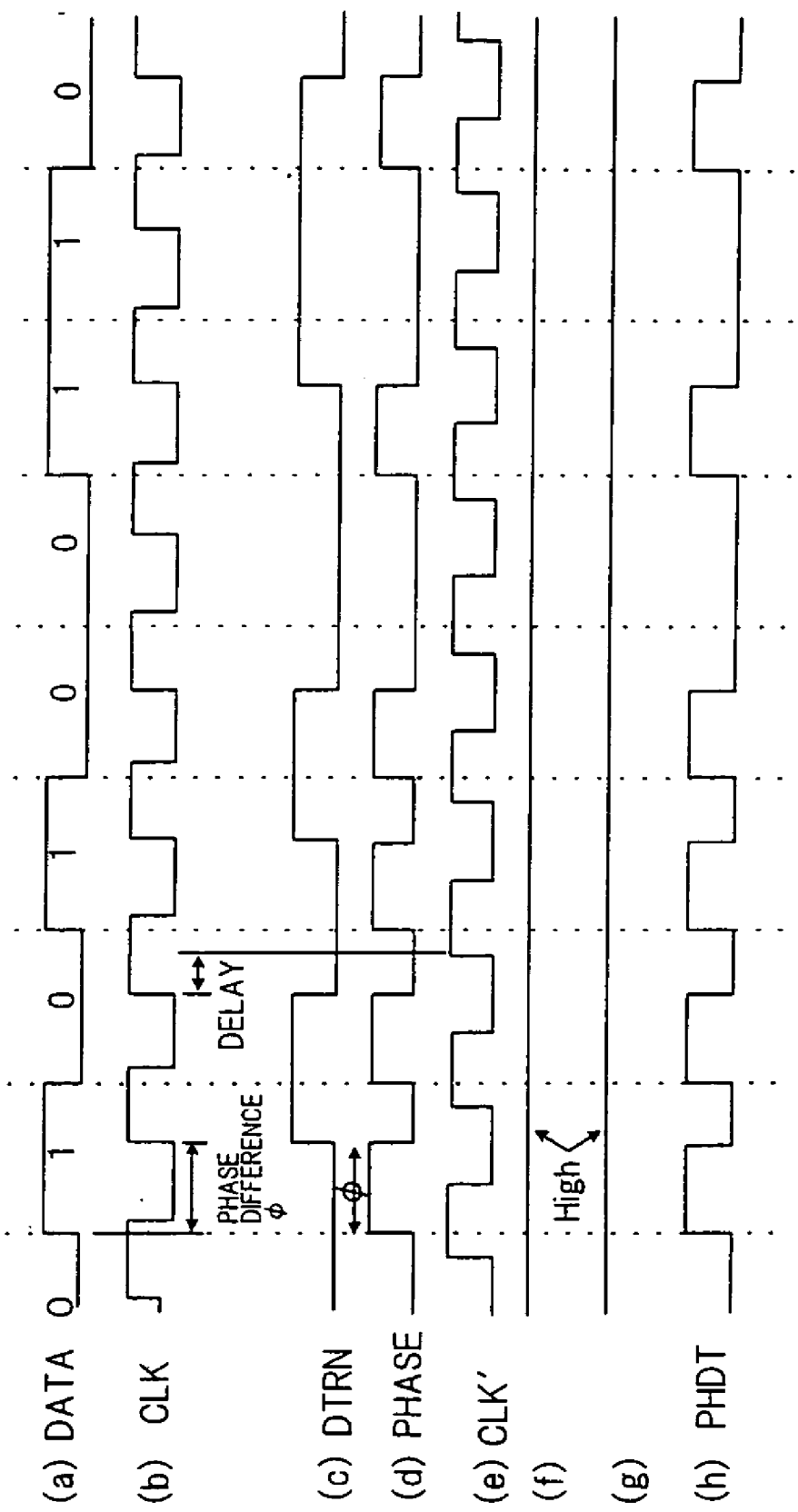
FIG. 14 is a timing chart associated with the phase comparator circuit according to the third aspect of the present invention (coincident frequencies; phase difference: $\pi/2$ to $3\pi/2$)

FIG. 14 is a time chart associated with the phase comparator circuit according to the third aspect of the present invention. This is for a case where the frequencies of the data signal and clock signal coincide and the phase difference resides in the phase control range ($\pi/2$ to $3\pi/2$). In this case the outputs of the D-FF2 and D-FF3 do not assume the low level and the latch circuit 32 outputs the phase-difference signal PHASE (d) as the phase detection signal PHDT (h).

Figure 15:
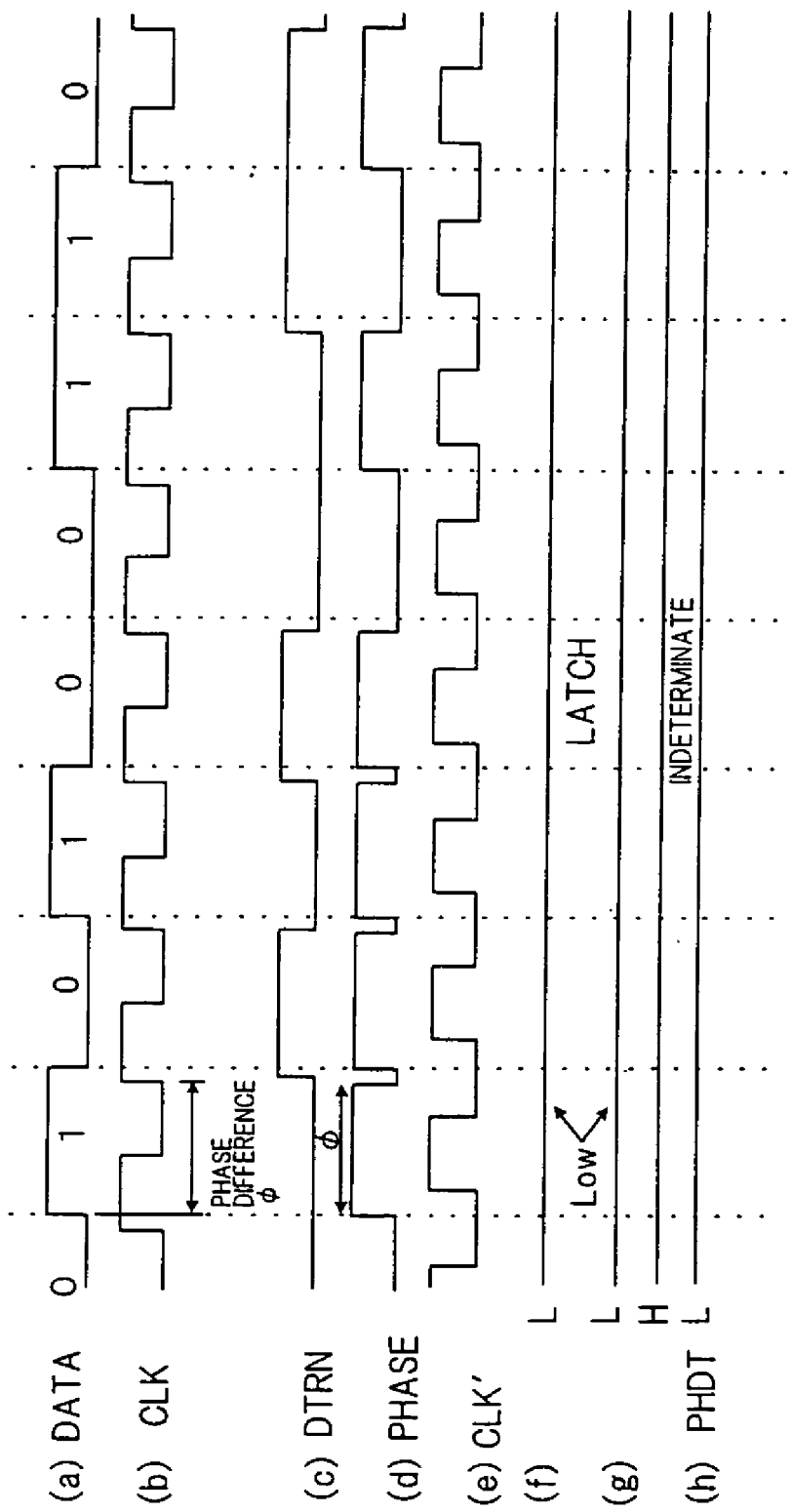
FIG. 15 is a timing chart associated with the phase comparator circuit according to the third aspect of the present invention (coincident frequencies; phase difference: 0 to $\pi/2$, $3\pi/2$ to $2\pi$)

FIG. 15 is a time chart associated with the phase comparator circuit according to the third aspect of the present invention. This is for a case where the frequencies of the data signal and clock signal coincide and the phase difference resides in the erroneous-synchronization phase range (0 to $\pi/2$, $3\pi/2$ to $2\pi$). In this case the outputs of the D-FF2 and D-FF3 are always at the low level. Accordingly, the latch circuit 32 latches and outputs the level of the phase-difference signal PHASE that prevails when the D-FF3 is at the low level.

FIGS. 16 and 17 are time charts associated with the phase comparator circuit according to the third aspect of the present invention. FIG. 16 is for a case where the clock frequency is higher than the frequency of the data, and FIG. 17 is for a case where the clock frequency is lower than the frequency of the data.

If the frequency of the clock signal CLK is higher than the frequency of the data signal DATA (FIG. 16), the phase of the clock signal CLK continues to lead that of the data signal DATA. At this time the output signal (g) of the D-FF3 repeatedly takes on the high and low levels. Consequently, the phase detection signal PHDT (h) is latched part of the time. The latch timing is decided by the falling edge of the clock signal CLK after the duty of the phase-difference signal PHASE (d) falls below 25%.

Figure 18A:
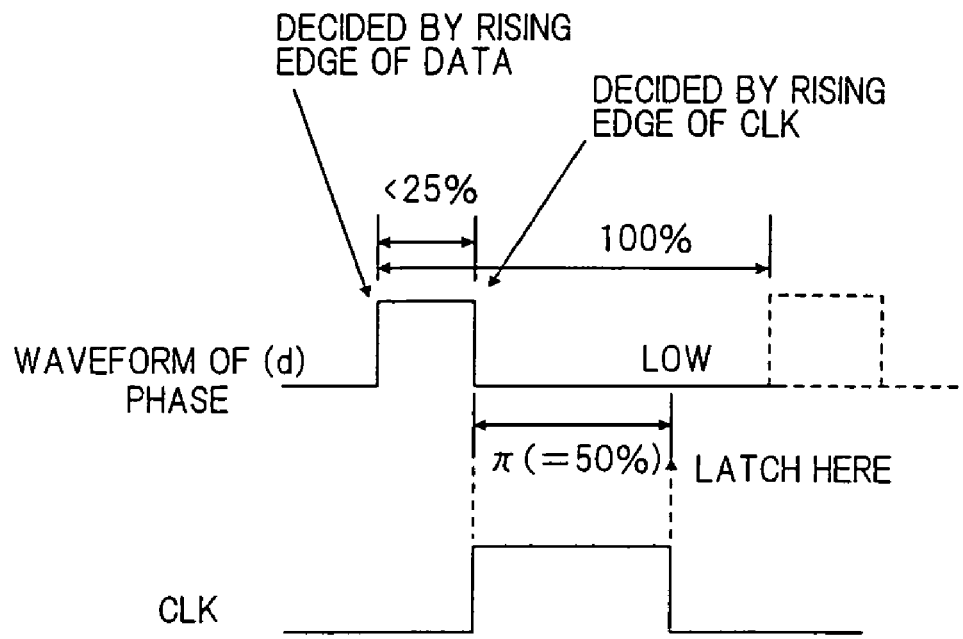
FIGS. 18A and 18B are diagrams useful in describing latch timing.

The falling edge of the phase-difference signal PHASE (d) is decided by the rising edge of the clock signal CLK. At the earliest the ensuing rising edge of the phase-difference signal PHASE (d) occurs after a period of time corresponding to a duty of 75%. Consequently, the phase-difference signal PHASE (d) always is at the low level at the falling edge of the clock signal CLK (i.e., after 50%). Accordingly, in a case where the frequency of the clock signal CLK is higher than the frequency of the data, the average value of the phase detection signal PHDT (h) shifts to the low side by a large amount. This makes it possible to detect a shift in frequency. FIG. 18A is a diagram useful in describing latch timing when the frequency of the clock signal is higher than that of the data signal. Conversely, if the frequency of the clock signal CLK is lower than that of the data signal DATA (FIG. 17), the phase of the clock signal CLK continues to lag behind that of the data signal DATA. The timing of the latch at this time is decided by the falling edge of the clock signal CLK after the duty of the phase-difference signal PHASE (d) exceeds 75%.

Figure 18B:
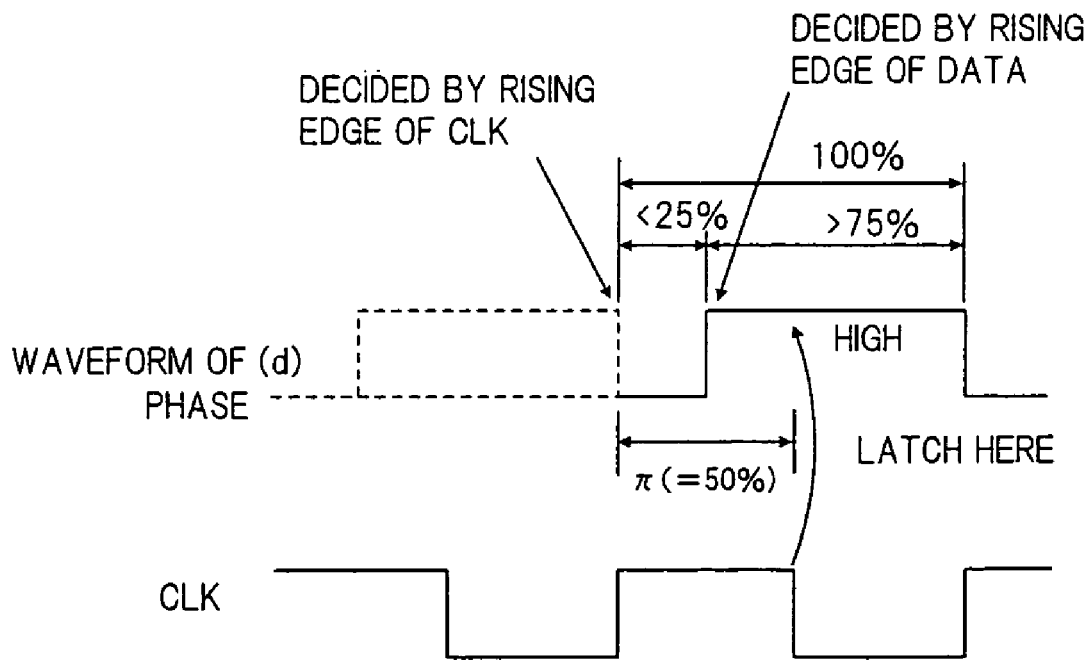

The falling edge of the phase-difference signal PHASE (d) is decided by the rising edge of the clock signal CLK. At the latest the ensuing rising edge of the phase-difference signal PHASE (d) occurs after a period of time corresponding to a duty of 25%. Consequently, the phase-difference signal PHASE (d) is always at the high level at the falling edge of the clock signal CLK (i.e., after 50%). Thus, when the clock frequency is lower than the data frequency, latching always takes place at the high level and, hence, the average value of the phase detection signal PHDT (h) shifts to the high side by a large amount. The foregoing operation makes it possible to detect a shift in phase. FIG. 18B is a diagram useful in describing latch timing when the frequency of the clock signal is lower than that of the data signal.

Thus, the latch level differs depending upon how high or low the clock frequency is. By referring to the average value of the phase detection signal, therefore, it is also possible to detect which frequency is higher, namely that of the clock signal or that of the data signal.

(c) Second Embodiment

Figure 19:
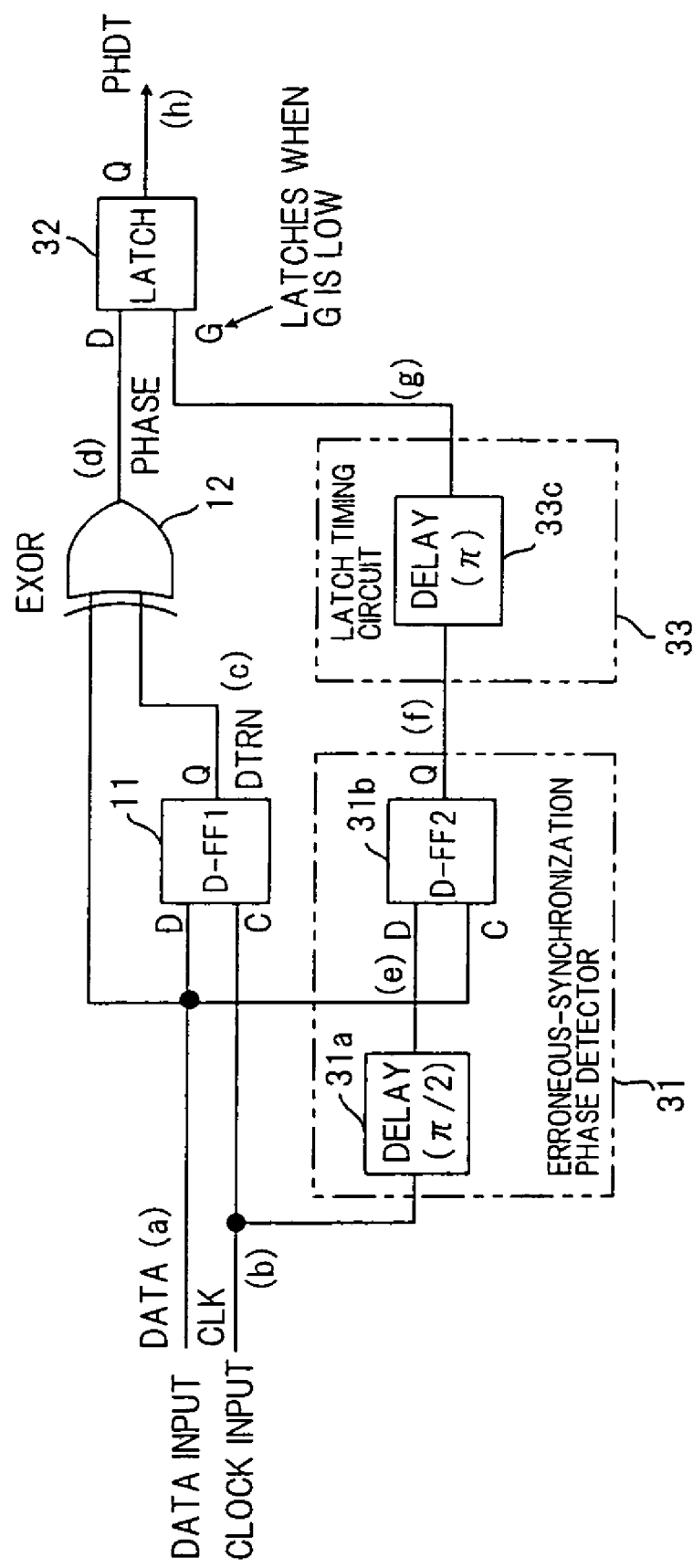
FIG. 19 is a diagram showing the construction of a second embodiment of the phase comparator circuit according to the third aspect of the present invention.

FIG. 19 is a block diagram showing a phase comparator circuit which is a second embodiment of the third aspect of the present invention. Components in FIG. 19 identical with those shown in FIG. 13 are designated by like reference characters. This embodiment differs from the first embodiment in that whereas the falling edge of the clock signal CLK is the latch timing in the first embodiment, the latch timing in the second embodiment is that following elapse of a period of time, which corresponds to the phase n, from the rising edge of the data signal DATA. Operation of the second embodiment is identical with that of the first embodiment in other respects.

The phase comparator circuit according to this embodiment includes the first D-type flip-flop (D-FF1) 11, the EX-OR circuit 12 for outputting a signal that conforms to the phase difference between the data signal DATA and the clock signal CLK, the erroneous-synchronization phase detector 31 for detecting whether the phase difference between the data signal DATA and the clock signal CLK resides within a range of phases (0 to $\pi/2$, $3\pi/2$ to $2\pi$) for which there is a possibility of erroneous synchronization, the latch circuit 32 for outputting the phase detection signal PHDT, and the latch timing circuit 33 for deciding latch timing. The latch timing circuit 33 is constituted by a delay circuit 33c for delaying the output level of the D-FF2 by a time corresponding to the phase $\pi$.

FIG. 20 is a diagram useful in describing the latch timing of the second embodiment.

Figure 20A:
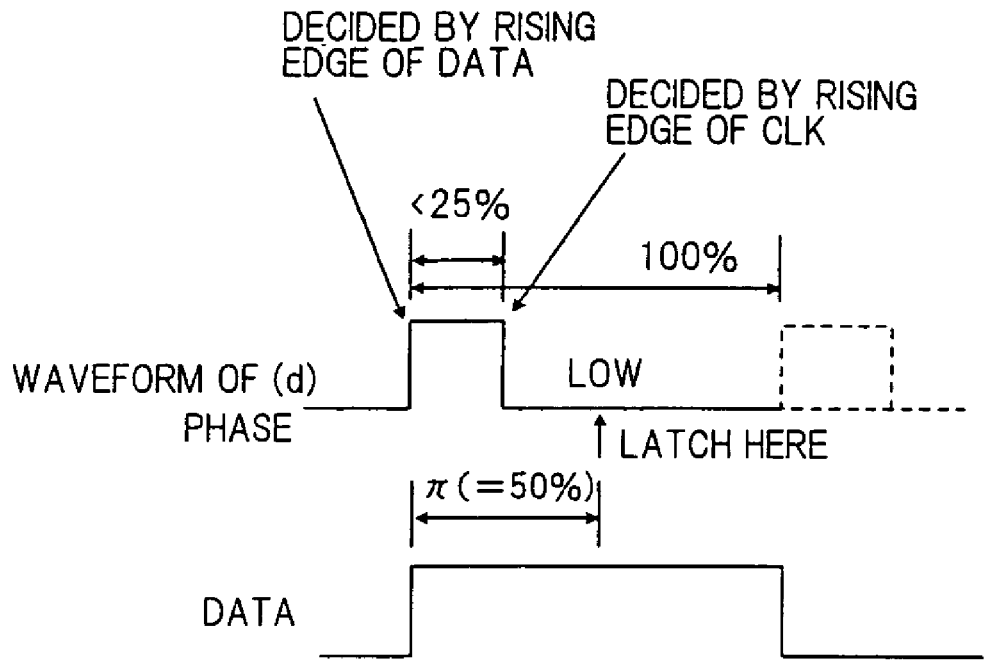
FIGS. 20A and 20B are diagrams useful in describing latch timing.

If the frequency of the clock signal CLK is higher than the frequency of the data signal DATA (FIG. 16), the phase of the clock signal CLK continues to lead that of the data signal DATA. At this time the output signal (g) of the latch timing circuit 33 repeatedly takes on the high and low levels and the phase detection signal PHDT (h) is latched at a fixed value for part of the time. As shown in FIG. 20A, the latch timing is that following elapse of a period of time, which corresponds to a (50% calculated in terms of duty), from the rising edge of the data signal DATA after the duty of the phase-difference signal PHASE has fallen below 25%.

The rising edge of the phase-difference signal PHASE (d) is decided by the rising edge of the data signal DATA. Consequently, the phase-difference signal PHASE (d) always is at the low level at elapse of a period of the time, which corresponds to $\pi$ (duty=50%), from the rising edge of the data signal DATA. Accordingly, in a case where the frequency of the clock signal CLK is higher than the frequency of the data, the average value of the phase detection signal PHDT (h) shifts to the low side by a large amount. This makes it possible to detect a shift in frequency.

Figure 20B:
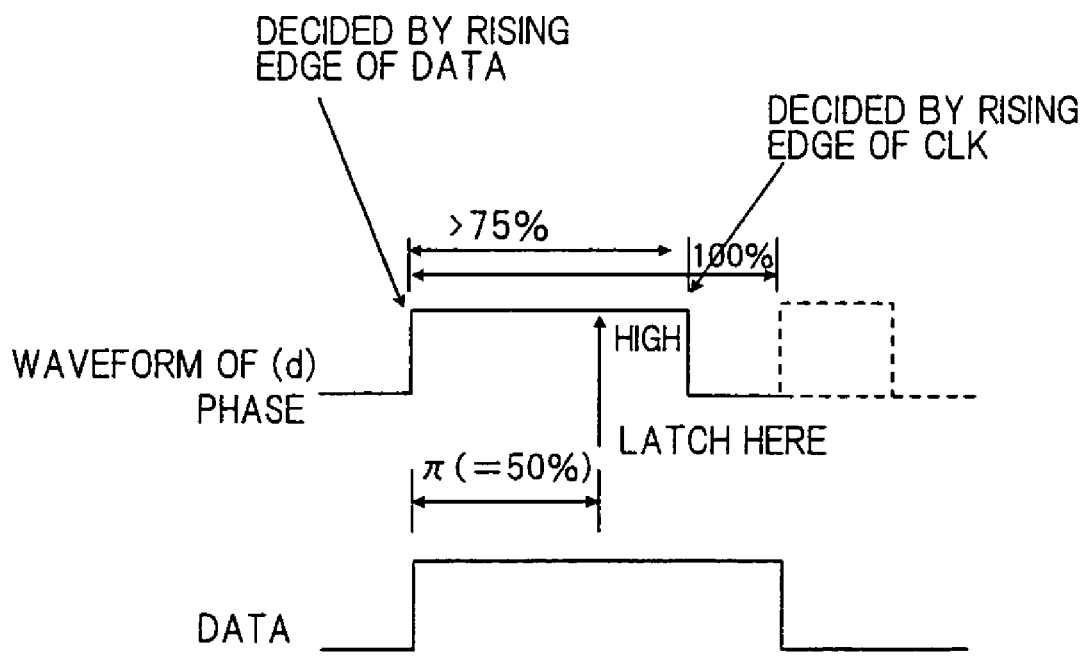

Conversely, if the frequency of the clock signal CLK is lower than that of the data signal DATA (FIG. 17), the phase of the clock signal CLK continues to lag behind that of the data signal DATA. As shown in FIG. 20B, the latch timing is that following elapse of a period of time, which corresponds to π (duty=50%), from the rising edge of the data signal DATA after the duty of the phase-difference signal PHASE has exceeded below 75%.

The rising edge of the phase-difference signal PHASE (d) is decided by the rising edge of the data signal DATA. Consequently, the phase-difference signal PHASE (d) is always at the high level at elapse of a period of time, which corresponds to π (duty=50%), from the rising edge of the data signal DATA. Thus, when the clock frequency is lower than the data frequency, latching always takes place at the high level and, hence, the average value of the phase detection signal PHDT (h) shifts to the high side by a large amount. The foregoing operation makes it possible to detect a shift in phase. If the clock frequency is higher, a converse shift takes place. It is possible, therefore, to detect which frequency is higher.

(d) Third Embodiment

Figure 21:
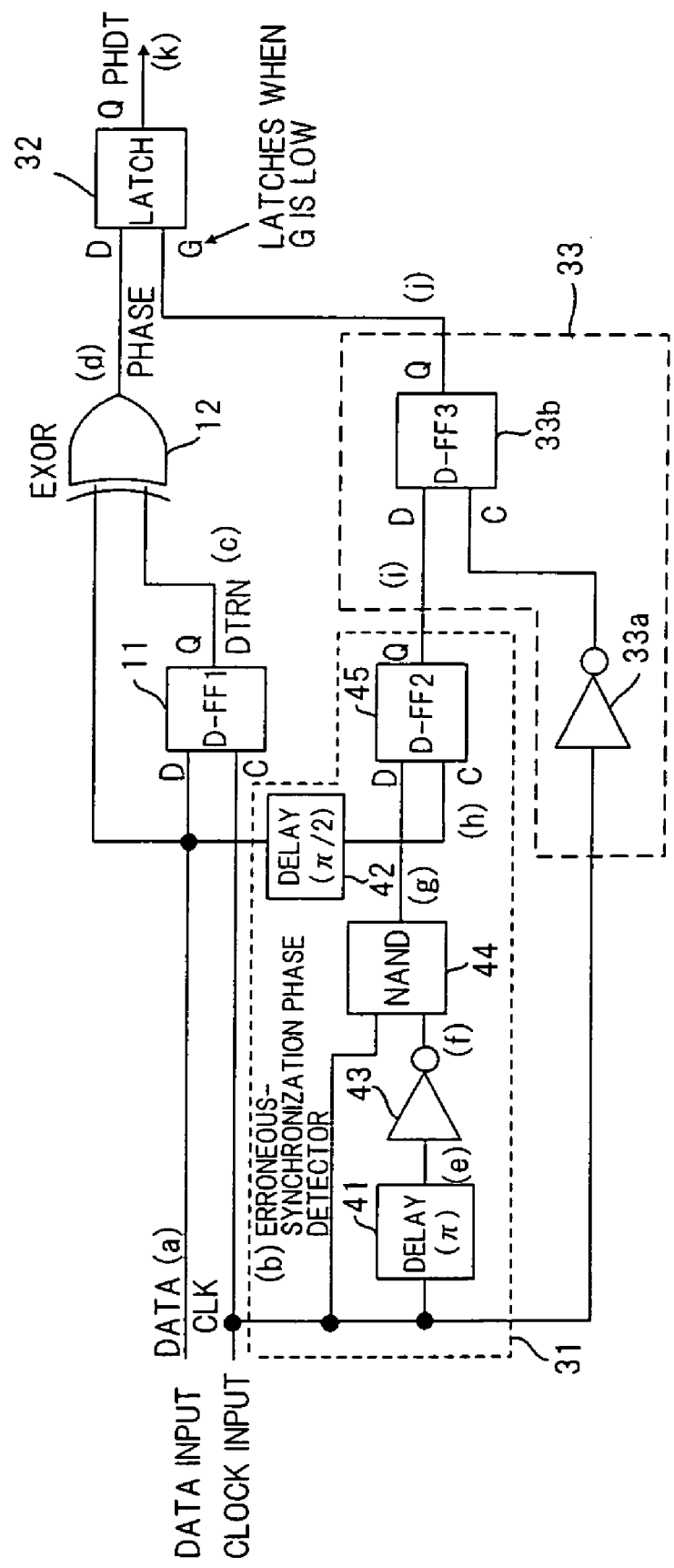
FIG. 21 is a diagram showing the construction of a third embodiment of the phase comparator circuit according to the third aspect of the present invention.

FIG. 21 is a block diagram showing a phase comparator circuit which is a third embodiment of the third aspect of the present invention. Components in FIG. 21 identical with those shown in FIG. 13 are designated by like reference characters. This embodiment differs from the first embodiment in the construction of the erroneous-synchronization phase detector 31; the two embodiments are identical in construction in all other respects.

The erroneous-synchronization phase detector 31 includes a first delay circuit 41 for delaying the clock signal CLK by a length of time corresponding to the phase π, a second delay circuit 42 for delaying the data signal DATA by a length of time corresponding to phase π/2, an inverter 43 for inverting the polarity of the delayed clock signal, a NAND gate 44 for computing the NAND between the clock signal CLK (b) and the delayed inverted clock signal output by the inverter 43, and a D-type flip-flop (D-FF2) for holding the level of the output signal (g) of NAND gate 44 prevailing at the rising edge of the output signal (h) from the second delay circuit 42.

Figure 22:
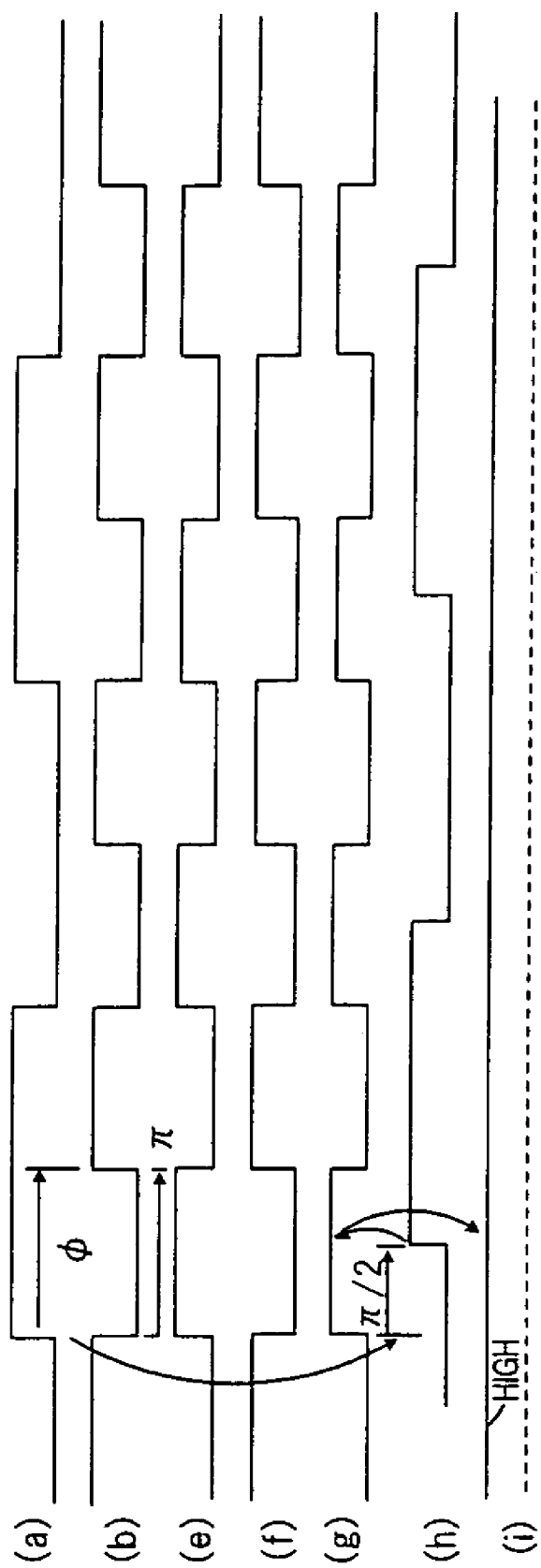
FIG. 22 is a timing chart associated with the third embodiment.

The output signal (g) of NAND gate 44 input to the data terminal of the D-FF2 corresponds to the signal obtained by delaying the phase of the clock signal CLK by x, as is apparent from the time chart of FIG. 22. Further, the output signal of the second delay circuit 42 input to the clock terminal of the D-FF2 is the result of delaying the data signal DATA by π/2. Accordingly, the phase relationship of the clock signal and data signal input to the data terminal and clock terminal of the D-FF2 is the same as that of the first embodiment. In the erroneous-synchronization phase detector 31 of the third embodiment, therefore, the D-FF2 holds the low level if the phase difference resides in the erroneous-synchronization phase range (0 to π/2, 3π/2 to 2π). In other words, whether the phase difference resides in the erroneous-synchronization phase range can be discriminated depending upon whether the output level of the D-FF2 is the low level.

If the output of the D-FF2 is at the low level, the latch timing circuit 33 inputs the latch timing to the latch circuit 32 at the falling edge of the clock signal CLK. The latch circuit 32 (1) outputs the phase-difference signal PHASE (d) as the phase detection signal PHDT if the phase difference between the data signal and the clock signal resides within the phase control range (π/2 to 3π/2), (2) fixes the phase detection signal PHDT at the first set value (the high level) if the phase difference between the data signal and the clock signal resides within erroneous-synchronization phase range (0 to π/2, 3π/2 to 2π) and, moreover, the phase difference is varying in an increasing direction (i.e., when the frequency of the clock signal is lower than that of the data signal), and (3) fixes the phase detection signal PHDT at the second set value (the low level) if the phase difference between the data signal and the clock signal resides within erroneous-synchronization phase range and, moreover, the phase difference is varying in a decreasing direction (i.e., when the frequency of the clock signal is higher than that of the data signal). Further, the latch circuit 32 releases the latch and delivers the phase-difference signal PHASE (d) output by the EX-OR circuit 12.

Figure 23:
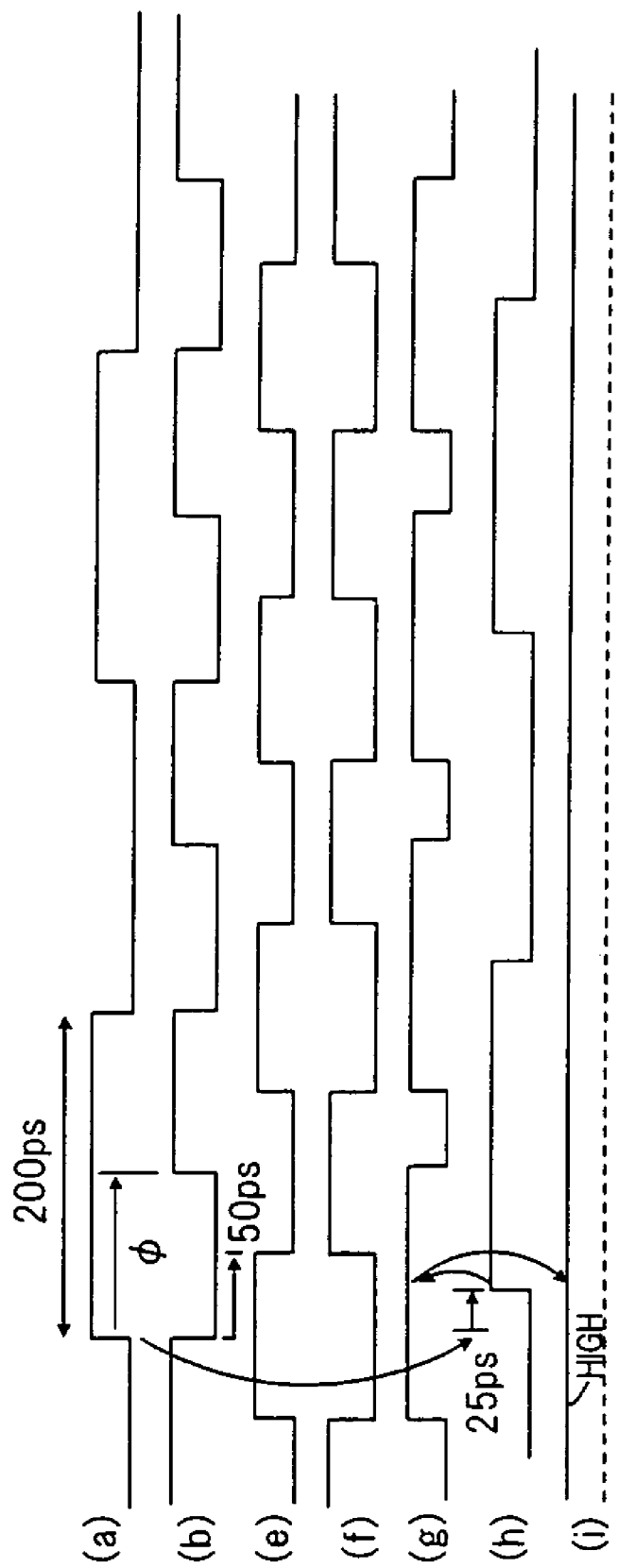
FIG. 23 is a timing chart in a case where a data signal having a data frequency of 5 Gbps has been entered when 2π=100 ps (10 Gbps)

The characterizing feature of the phase comparator circuit according to the third embodiment is that the first delay circuit 41 and second delay circuit 42 are implemented not by phase but by absolute delay time [e.g., at 10 Gbps, delay time DELAY(π)=50 ps, DELAY(π/2)=25 ps], thereby making it possible to apply this embodiment to signals other than 10-Gbps signals (e.g., to 5-Gbps signals) as well. In such case latching timing can be carried out at a phase in the vicinity of coincidence of the rising edges of the data and clock signals. FIG. 23 is a timing chart for a case where the data frequency is 5 Gbps.

(e) Fourth Embodiment

Figure 24:
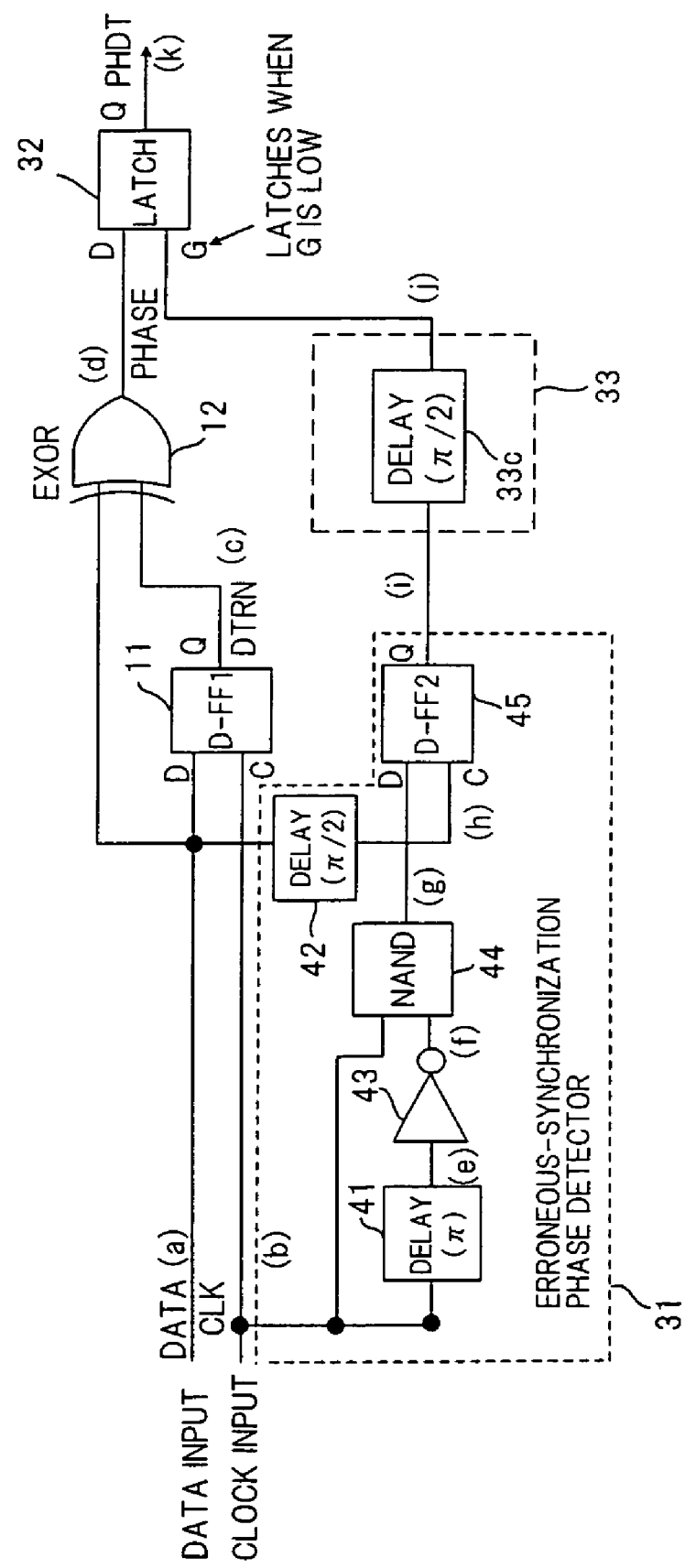
FIG. 24 is a diagram showing the construction of a fourth embodiment of the phase comparator circuit according to the third aspect of the present invention.

FIG. 24 is a block diagram showing a phase comparator circuit which is a fourth embodiment of the third aspect of the present invention. Components in FIG. 24 identical with those shown in FIG. 21 are designated by like reference characters. This embodiment differs from the third embodiment in the construction of the latch timing circuit 33; the two embodiments are identical in construction in all other respects. In the third embodiment, the falling edge of the clock signal CLK is the latch timing. According to the fourth embodiment, however, the latch timing is that following elapse of a period of time, which corresponds to the phase π, from the rising edge of the data signal DATA.

As shown in FIG. 24, the phase comparator circuit includes the first D-type flip-flop (D-FF1) 11, the EX-OR circuit 12 for outputting a signal that conforms to the phase difference between the data signal DATA and the clock signal CLK, the erroneous-synchronization phase detector 31 for detecting whether the phase difference between the data signal DATA and the clock signal CLK resides within a range of phases (0 to π/2, 3π/2 to 2π) for which there is a possibility of erroneous synchronization, the latch circuit 32 for outputting the phase detection signal PHDT, and the latch timing circuit 33 for deciding latch timing. The latch timing circuit 33 is constituted by a delay circuit 33c for delaying the output level of the D-FF2 by a time corresponding to the phase π/2.

(D) Phase Comparator Circuit to which Duty Compensation Circuit is Connected

Figure 25:
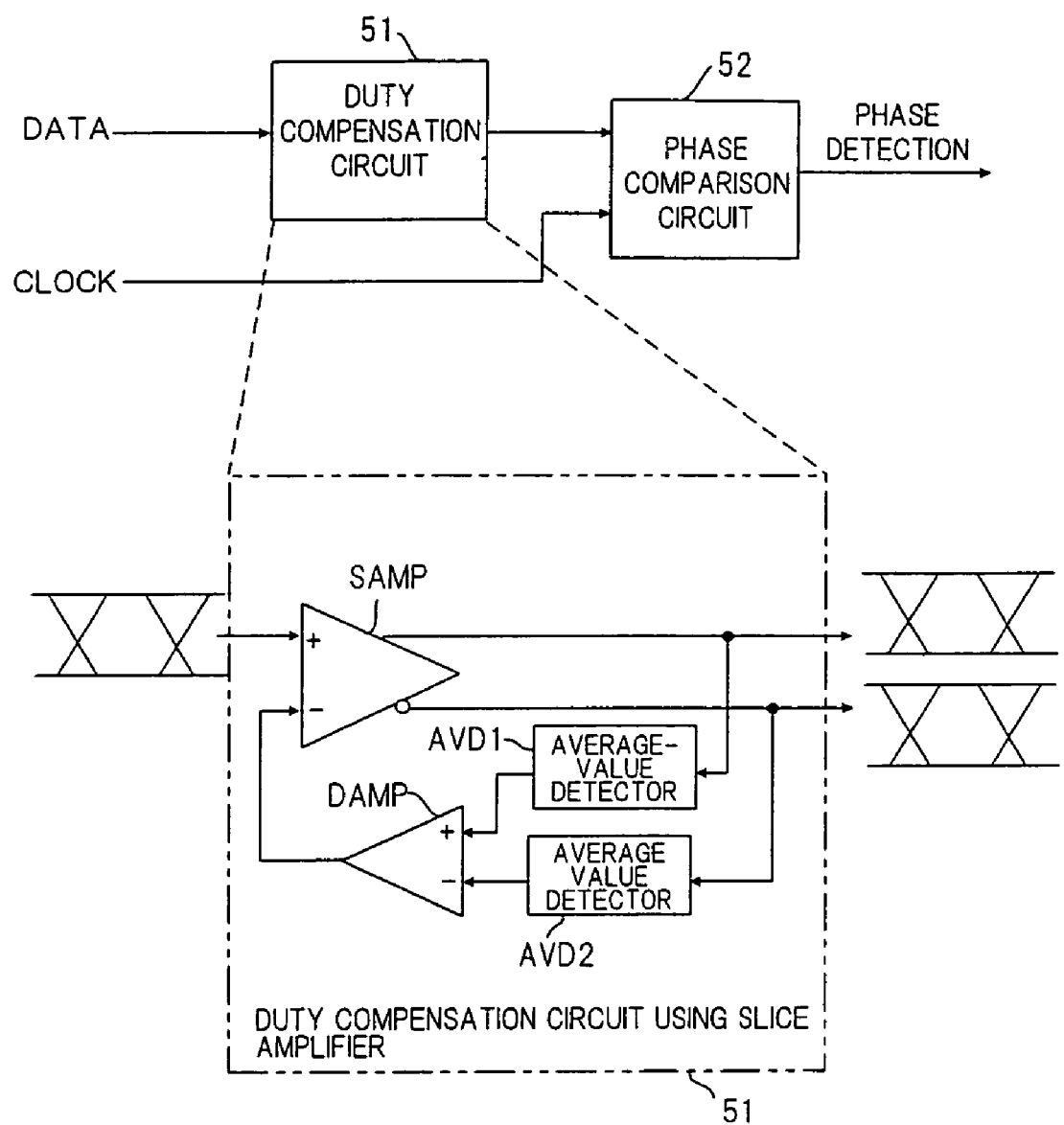
FIG. 25 is a diagram showing the construction of a fourth aspect of the present invention.

FIG. 25 is a diagram showing the construction of a fourth aspect of the present invention in which a duty compensation circuit is provided as an input stage to the phase comparator circuit. Specifically, numeral 51 denotes a duty compensation circuit which compensates for the duty of the data signal DATA, and numeral 52 denotes any of the phase comparator circuits of the first to third aspects of the present invention. The data signal DATA enters the phase comparator circuit 52 upon being acted upon by the duty compensation circuit 51.

Figure 26A:
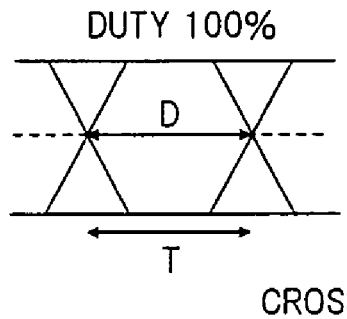
FIGS. 26A to 26C showing a shift in the duty of a high-speed signal.
Figure 26B:
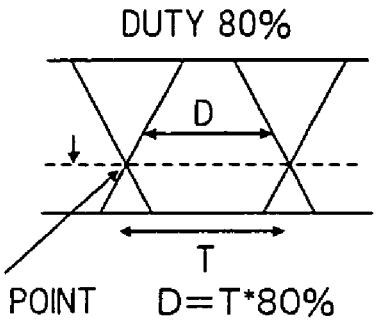
Figure 26C:
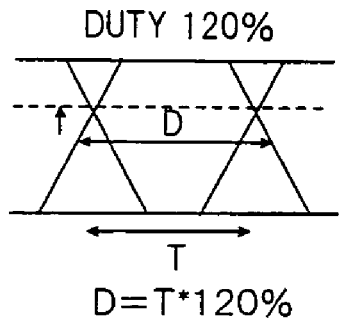
Figure 27:
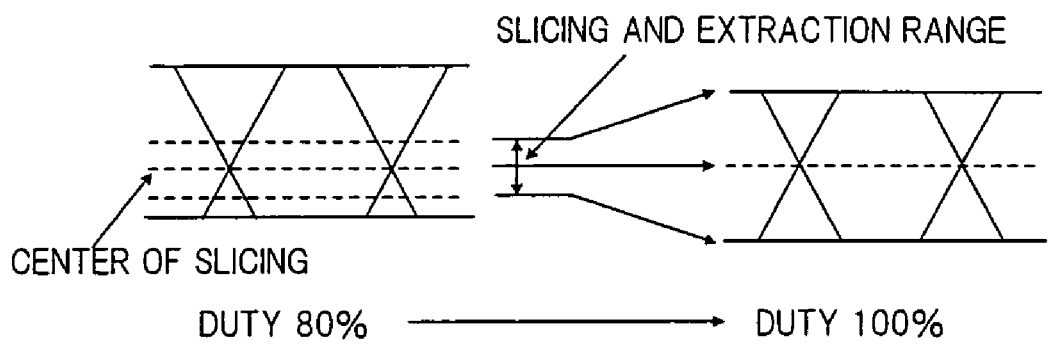
FIG. 27 is a diagram showing duty compensation by slice amplification.
Figure 28:
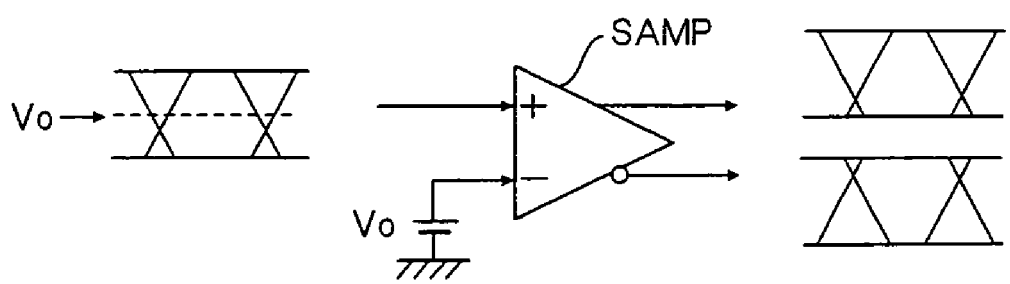
FIG. 28 is a diagram of a slice amplifier having an inverted output.
Figure 29:
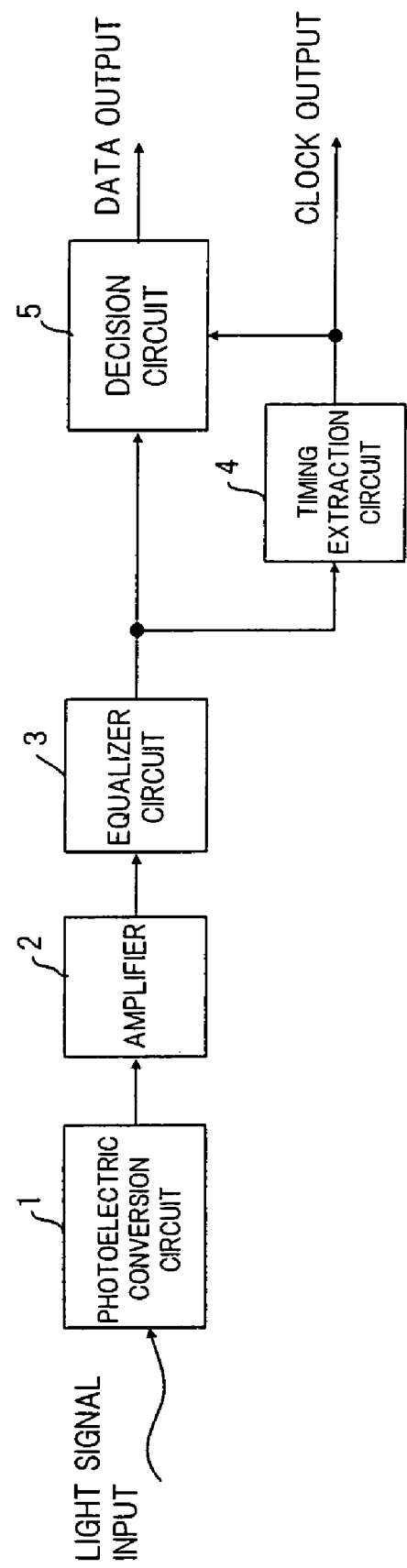
FIG. 29 is a block diagram of an optical receiver.
Figure 30:
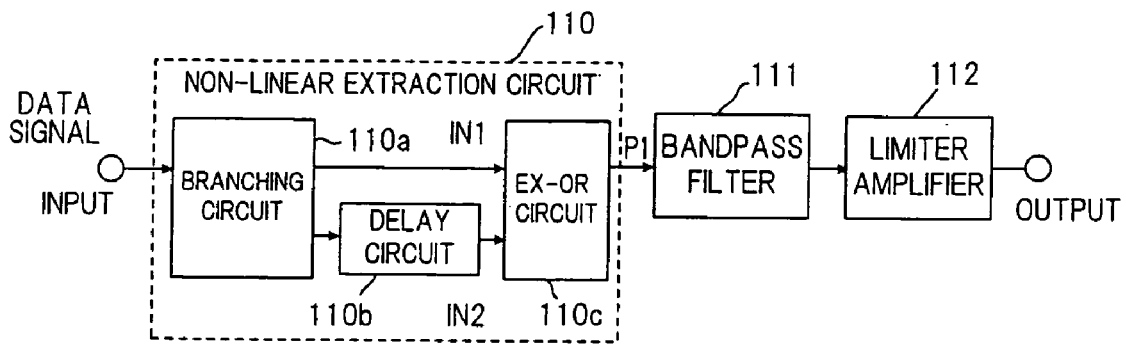
FIG. 30 is a diagram showing the construction of a timing extraction circuit that employs non-linear extraction.
Figure 31:
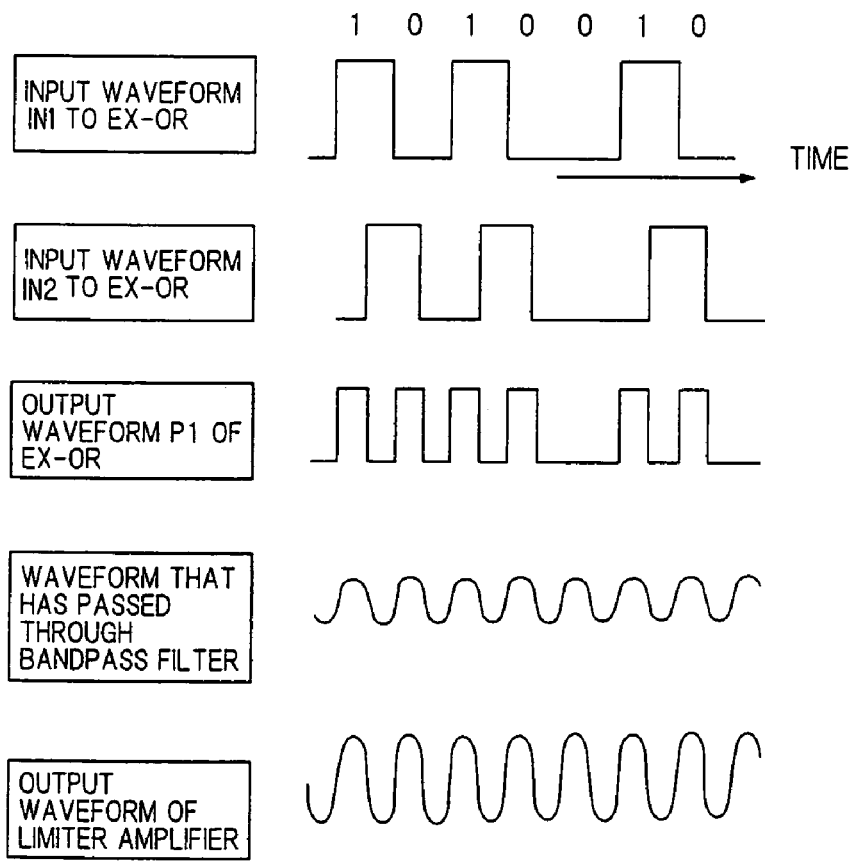
FIG. 31 is a waveform diagram useful in describing operation.
Figure 32:
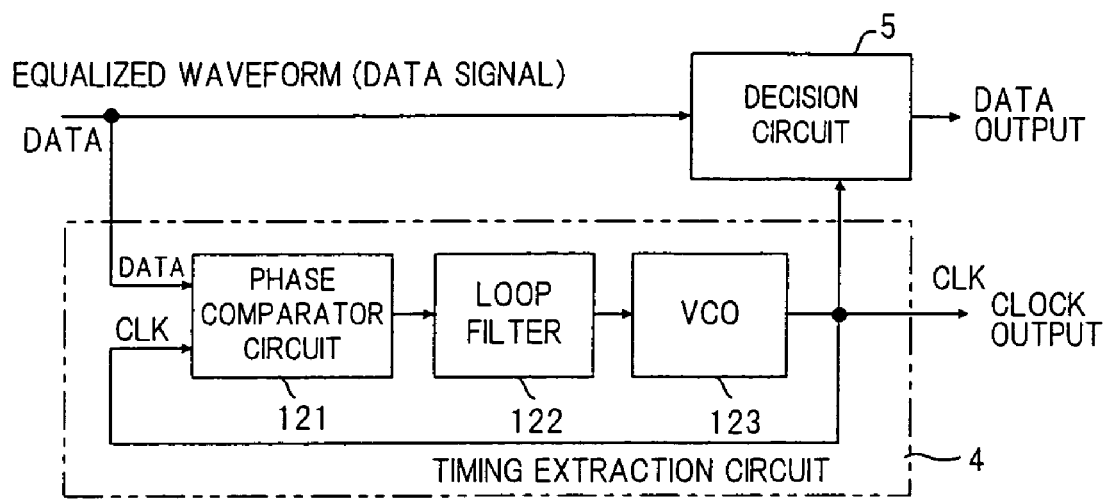
FIG. 32 is a diagram showing the construction of a prior-art timing extraction circuit using a PLL.

For a signal having a speed so high that the rise and fall times of the waveform are not negligible, duty shift appears as cross-point shift, as illustrated in FIGS. 26A to 26C. It is possible to return the duty to 100% by subjecting such a signal to slice amplification about the cross-point voltage, as illustrated in FIG. 27. FIG. 28 is a diagram of a slice amplifier SAMP having inverted and non-inverted outputs.

If the center voltage ($V_0$) of slicing has shifted from the cross point, the duty at the non-inverted output differs from that at the inverted output and the average voltages of the outputs differ as well.

As shown in FIG. 25, the average values of the non-inverted output and inverted output of the slice amplifier SAMP are obtained by average-value detection circuits AVD1, AVD2, respectively, and the slicing center voltage is subjected to feedback control in such a manner that these average values will coincide, thereby making it possible to output signals having a duty of 100% from both outputs of the slice amplifier SAMP. In other words, if the difference between the average values of the non-inverted and inverted outputs is obtained by a differential amplifier DAMP and this difference is set as the slice voltage of the slice amplifier SAMP, the duty of the data signal output by the duty compensation circuit 51 can be made to approach 100%.

In accordance with the fourth aspect of the present invention, it is possible to enlarge the range of duty variation capable of being dealt with by the phase comparator circuit 52. In addition, the phase comparator circuit 52 has only to act on the duty deviation from 100% which the duty compensation circuit cannot compensate, thereby making it possible to reduce the range of erroneous synchronization phases and enlarge the range over which phase can be controlled.

Thus, in accordance with the present invention, as described above, if the phase difference between a data signal and a clock signal resides within a range of phases for which there is a possibility of erroneous synchronization, a phase detection signal is set to a fixed value. As a result, slopes having the same direction can be made just one in one period of the phase comparison characteristic, even if the duty shifts from 100%. Consequently, phases for which the average values of the phase-difference signals are the same can be made just one in one period, and it is possible to eliminate erroneous synchronization in which a PLL circuit is locked to a phase other than the target phase.

Further, in accordance with the present invention, the data signal is discriminated using a clock signal that has been modulated in phase by a phase modulation circuit which modulates the phase of the clock signal. Even if duty shifts from 100%, slopes having the same direction can be made just one in one period by smoothly varying a sudden discontinuity in the phase comparison characteristic. As a result, phases for which the average values of the phase-difference signals are the same can be made just one in one period, thereby eliminating erroneous synchronization in which a PLL circuit is locked to a phase other than a target phase.

Further, in accordance with the present invention, the phase detection signal is fixed at a first set value if the phase difference between the data signal and the clock signal falls within a range of phases for which erroneous synchronization is possible and, moreover, the phase difference is varying in an increasing direction (i.e., when the frequency of the clock signal is lower than that of the data signal), and the phase detection signal is fixed at a second set value if the phase difference between the data signal and the clock signal falls within the above-mentioned range of phases and, moreover, the phase difference is varying in a decreasing direction (i.e., when the frequency of the clock signal is higher than that of the data signal). As a result, slopes having the same direction can be made just one in one period of the phase comparison characteristic, even if the duty shifts from 100%. Consequently, phases for which the average values of the phase-difference signals are the same can be made just one in one period, and it is possible to eliminate erroneous synchronization in which a PLL circuit is locked to a phase other than the target phase. As a result, the average value of the phase-difference signal increases if the clock frequency is low and decreases if the clock frequency is high. This makes it possible for the PLL circuit to recognize the synchronization pull-in direction in dependence upon the magnitude of the average value and to pull the clock frequency into the prescribed frequency in a short period of time. In other words, the synchronization pull-in range of the PLL circuit can be enlarged and pull-in time can be shortened.

In an optical communications system, the higher the transmission rate, the greater the effects of waveform distortion owing to such factors as the non-linear characteristic of optical fiber. This waveform distortion causes the duty of the data signal to vary. There is a possibility that the conventional phase comparator circuit will malfunction in such case. In accordance with the phase comparator circuit of the present invention, however, PLL control can be implemented without incorrect synchronization even if the duty of the data signal shifts from 100%.

Further, in accordance with the present invention, using a duty compensation circuit makes it possible to enlarge the range of duty variation capable of being dealt with, and the phase comparator circuit has only to act on the duty deviation from 100% which the duty compensation circuit cannot compensate. This makes it possible to reduce the range of erroneous synchronization phases and to enlarge the range over which phase control can be carried out.

As many apparently widely different embodiments of the present invention can be made without departing from the spirit and scope thereof, it is to be understood that the invention is not limited to the specific embodiments thereof except as defined in the appended

What is claimed is:

1. A phase comparison circuit, comprising:
    a data discriminator to which a data signal is input for discriminating the data signal using a clock signal:
    a detector for outputting a phase-difference signal representing a phase difference between the data signal and the clock signal:
    a clock generator which generates the clock signal synchronized to the data signal based on the phase-difference signal:
    an erroneous-synchronization phase detector for detecting whether the phase difference between the data signal and the clock signal resides within a range of phases for which there is a possibility of erroneous synchronization; and
    a output fixing unit for outputting the phase-difference signal if the phase difference falls outside the range of phases and outputting a fixed value if the phase difference resides within the range of phases,
    wherein the possibility of erroneous synchronizations occurs where the data signal duty cycle shifts from 100%.

2. The circuit according to claim 1, wherein said erroneous-synchronization phase detector includes:
    a clock signal level detection circuit for detecting a clock signal level at a rising edge of the data signal and a clock signal level at a falling edge of the data signal; and
    a detector for detecting, on the basis of these two clock signal levels, whether the phase difference resides within the range of phases for which there is a possibility of erroneous synchronization.

3. A phase comparison circuit, comprising:
    a data discriminator to which a data signal is input for discriminating the data signal using a clock signal:

a detector for outputting a phase-difference signal representing a phase difference between the data signal and the clock signal:

a clock generator which generates the clock signal synchronized to the data signal based on the phase-difference signal:

an erroneous-synchronization phase detector for detecting whether the phase difference between the data signal and the clock signal resides within a range of phases for which there is a possibility of erroneous synchronization; and an output fixing unit for (a) outputting the phase-difference signal if the phase difference between the data signal and the clock signal falls outside said range of phases, (b) outputting a first set value if the phase difference resides within said range of phases and is varying in an increasing direction, and (c) outputting a second value if the phase difference resides within said range of phases and is varying in a decreasing direction, wherein the possibility of erroneous synchronizations occurs where the data signal duty cycle shifts from 100% and a data signal that has been acted upon by a circuit that compensates for duty is adopted as said data signal.

4. A phase comparison circuit, comprising:

a data discriminator to which a data signal is input for discriminating the data sigal using a clock signal:

a detector for outputting a phase-difference signal representing a phase difference between the data signal and the clock signal:

a clock generator which generates the clock signal synchronized to the data signal based on the phase-difference signal:

an erroneous-synchronization phase detector for detecting whether the phase difference between the data signal and the clock signal resides within a rage of phases for which there is a possibility of erroneous synchronization; and an output fixing unit for (a) outputting the phase-difference signal if the phase difference between the data signal and the clock signal falls outside said range of phases, (b) outputting a first set value if the phase difference resides within said range of phases and is varying in an increasing direction, and (c) outputting a second value if the phase difference resides with said range of phases and is varying in a decreasing direction, wherein the possibility of erroneous synchronizations occurs where the data signal duty cycle shifts from 100%.

5. The circuit according to claim 4, wherein said erroneous-synchronization phase detector includes:

a delay circuit for delaying the phase of the clock signal by $\pi/2$ when the range of phases for which there is a possibility of erroneous synchronization is 0 to $\pi/2$ and $3\pi/2$ to $2\pi$; and a flip-flop for storing the level of the clock signal, which has been delayed in phase by $\pi/2$, at a rising edge of the data signal; and said output fixing unit has a latch which, if the output level of the flip-flop at a falling edge of the clock signal is a low level, latches the level of the phase-difference signal at this time and outputs this level as said first or second set value.

6. The circuit according to claim 5, wherein if the output level of said flip-flop at the falling edge of the clock signal attains a high level, said latch unlatches and outputs the phase-difference signal.

7. The circuit according to claim 4, wherein said erroneous-synchronization phase detector includes:

a first delay circuit for delaying the phase of the clock signal by $\pi/2$ when the range of phases for which there is a possibility of erroneous synchronization is 0 to $\pi/2$ and $3\pi/2$ to $2\pi$ a flip-flop for storing the level of the clock signal, which has been delayed in phase by $\pi/2$, at a rising edge of the data signal; and a second delay circuit for delaying an output signal of said flip-flop by a prescribed length of tine; and said output fixing unit has a latch which, if the output level of said second delay circuit is a low level, latches the level of the phase-difference signal at this time and outputs this level as said first or second set value.

8. The circuit according to claim 7, wherein if the output level of said second delay circuit attains a high level, said latch unlatches and outputs the phase-difference signal.

9. The circuit according to claim 4, wherein said erroneous-synchronization phase detector includes:

a first delay circuit for delay the phase of the clock signal by $\pi$;

an inverter for inverting the output level of said first delay circuit;

a NAND gate for performing a NAND operation between the clock signal and output from said inverter;

a second delay circuit for delaying the phase of the data signal by $\pi/2$; and a flip-flop for storing an output of said NAND gate at a rising edge of the data signal output from said second delay circuit; and said output fixing unit has a latch which, if the output level of said flip-flop at a falling edge of the clock signal is a low level, latches the level of the phase-difference signal at this time and outputs this level as said first or second set value.

10. The circuit according to claim 9, wherein if the output level of said flip-flop at the falling edge of the clock signal attains a high level, said latch unlatches and outputs the phase-difference signal.

11. The circuit according to claim 4, wherein said erroneous-synchronization phase detector includes:

a first delay circuit for delaying the phase of the clock signal by $\pi$;

an inverter for inverting the output level of said first delay circuit;

a NAND gate for performing a NAND operation between the clock signal and output from said inverter;

a second delay circuit for delaying the phase of the data signal by $\pi/2$; and a flip-flop for storing an output of said NAND gate at a rising edge of the data signal output from said second delay circuit; and said output fixing unit has:

a third delay circuit for delaying an output signal of said flip-flop by a prescribed length of time; and a latch which, if the output level of said third delay circuit is a low level, latches the level of the phase-difference signal at this time and outputs This level as said first or second set value.

12. The circuit according to claim 11, wherein if the output level of said third delay circuit attains a high level, said latch unlatches and outputs the phase-difference signal.

* * * * *